United States Patent
Bertanzetti

(10) Patent No.: US 7,739,568 B1
(45) Date of Patent: Jun. 15, 2010

(54) SCAN TESTING SYSTEM FOR CIRCUITS UNDER TEST

(75) Inventor: Darren Bertanzetti, Thornton, CO (US)

(73) Assignee: Marvell International Ltd., Hamilton (BM)

( * ) Notice: Subject to any disclaimer, the term of this patent is extended or adjusted under 35 U.S.C. 154(b) by 202 days.

(21) Appl. No.: 11/983,856

(22) Filed: Nov. 13, 2007

Related U.S. Application Data

(60) Provisional application No. 60/865,719, filed on Nov. 14, 2006.

(51) Int. Cl.
*G01R 31/28* (2006.01)
*G11B 27/00* (2006.01)

(52) U.S. Cl. .................. 714/729; 714/731; 714/814
(58) Field of Classification Search ............... None
See application file for complete search history.

(56) References Cited

U.S. PATENT DOCUMENTS

| 7,099,783 B2 * | 8/2006 | Hasegawa et al. ............ 702/57 |
| 7,237,162 B1 * | 6/2007 | Wohl et al. ................. 714/726 |
| 7,512,851 B2 * | 3/2009 | Wang et al. ................. 714/726 |

* cited by examiner

*Primary Examiner*—Christine T Tu

(57) ABSTRACT

A scan test circuit includes tester inputs that receive scan test data. Scan chains are coupled to the tester inputs. The tester outputs are coupled to the scan chains and provide output test data based on the scan test data. A first clock generates a first clock signal. A sampling circuit samples each of the tester outputs at least twice per clock cycle of the first clock signal.

46 Claims, 16 Drawing Sheets

US 7,739,568 B1

SCAN TESTING SYSTEM FOR CIRCUITS UNDER TEST

CROSS-REFERENCE TO RELATED APPLICATIONS

This application claims the benefit of U.S. Provisional Application No. 60/865,719, filed on Nov. 14, 2006. The disclosure of the above application is incorporated herein by reference in its entirety.

FIELD

The present disclosure relates to digital logic scan testing, and more particularly to techniques for reducing X-density associated with a circuit under test.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Scan-based testing is a technique that is used to internally test elements of a circuit under test (CUT), such as an application specific integrated circuit (ASIC). The testing may be performed to monitor operation of state variable devices (i.e. flip-flops and/or latches) and to detect core faults within the CUT. Scan-based testing replaces state variable devices that make up a sequential circuit by pseudo inputs and outputs. Values of the pseudo inputs and outputs can be set arbitrarily and monitored by connecting memory elements and/or sequential logic devices of the CUT in a serial shift register configuration. Each serial shift register is referred to as a scan chain. Serial shift (i.e. scan) actions are employed to set flip-flops of the CUT to an arbitrary set of values. Scan test data is shifted into the CUT, and resultant output test data is captured, sampled and monitored. This process transforms a sequential circuit into a virtual combinational circuit where scan in and out activities are defined as macro operations to set and monitor the state variables of the CUT.

With increased circuit complexity and thus an increased number of state variables, serial scanning becomes infeasible. For this reason, parallel scanning is implemented. In parallel scanning an overall scan chain is separated into a number of independently operable serial scan chains to reduce overhead. For example, a 100,000-bit serial scan chain may be implemented as 10 independently operable scan chains of 10,000 bits each. This reduces the total number of shift cycles necessary to load and unload the 100,000 bits by a factor of 10.

Referring to FIG. 1, a functional block diagram of a CUT 10 is shown. The CUT 10 includes scan chains 12, which are in parallel and have associated combinational logic circuits 14. The combinational logic circuits 14 are coupled between the scan chains 12. The CUT 10 also includes multiple Scan_In and Scan_Out tester pins 16, 18. A pair of Scan_In and Scan_Out pins is associated with each of the scan chains 12. Scan test data, which is controlled, is provided to the Scan_In pins 16. Output of the scan chains 12 is monitored via the Scan_Out pins 18.

Although parallel scanning can reduce the number of shift cycles of a scan-based test, parallel scanning is limited to the number of independently operable scan chains that can be implemented on an integrated circuit (IC). Each independent scan chain requires a pair of Scan_In/Scan_Out pins that are directly accessible using primary I/O pins of the IC. The number of I/O pins available for scan testing purposes may be limited.

As integrated circuit devices grow in size, corresponding scan chains also grow in size. With an increase in scan chain size comes an increase in the number of shifts required to load and unload data. Also, the larger the scan chains, the more data that is required from and used by a test system, which increases memory requirements to perform a test.

In addition, during scan testing automatic test pattern generation (ATPG) vectors are generated. For each ATPG vector, an input vector, an expected output vector, and a mask vector may be needed to indicate whether a test output bit value is reliable. Thus, a substantial amount of high-speed memory may be required to store test patterns and expected results. The total volume of test related data and the need for increased physical bandwidth (i.e. number of externally controllable parallel scan chains) are dominant factors in determining overall test cost of complex ICs.

As a result, data decompression and compression techniques are used to reduce the number of needed Scan_In/Scan_Out pins. A decompressor and a compressor may be provided on a CUT. As an example, scan test data may be provided to Scan_In pins, decompressed, and then provided to scan chains. Output signals of the scan chains may then be compressed and provided to Scan_Out pins. Put another way, a seed value may be scanned into a decompressor. The decompressor then produces actual test values, which are fed into the scan chains. With larger amounts of scan test data, more scan chains are used. This shortens scan chain length, which requires less test system memory and reduces test time.

During scan testing, unknown data can occur. Unknown data is represented as an X. Unknown data is generated external to scan chains and can cause monitored data and faults to be masked. The term mask refers to the inability to monitor and reliably use certain data, which is discarded. Data is unreliable when proper values of certain pin(s) are unknown, which can result from the reception of one or more Xs. Xs may be generated from uncontrollable devices that have unknown outputs during a scan test. Unknown outputs may be associated with, for example, random access memory (RAM)s, phase lock loops (PLL)s, delay lock loops (DLL)s, analog devices, embedded blocks, and/or other devices.

Compression algorithms can be adversely affected by a high X-density. An increase in the compression ratio of a compressor that is associated with a CUT increases the number of Xs per shift in a load and unload process. The viability of test data results decreases with an increase in X-density. Thus, the compression ratio is maintained at a low level when a high number of Xs are experienced. This provides viable test data results during scan testing.

X-density of a CUT is measured by how many X's there are during a load and unload of data. The X-density is equal to the number of X's divided by the number of shifts that occur during a load and unload process. As an example, a CUT may experience 100 Xs and 1000 shifts for a single capture event. Thus, the CUT has an X-density of 0.1 Xs per shift. When compression ratio is increased by ten (10) such that there are 100 shifts, the X-density is 1.0 Xs per shift. An X-density of 1.0 Xs per shift typically renders the compression output data useless.

SUMMARY

In one embodiment, a scan test circuit is provided and includes tester inputs that receive scan test data. Scan chains are coupled to the tester inputs. The tester outputs are coupled to the scan chains and provide output test data based on the scan test data. A first clock generates a first clock signal. A sampling circuit samples each of the tester outputs at least twice per clock cycle of the first clock signal. In other features, the scan chains generate scan chain output signals that are offset from each other in time.

In other features, the scan chains generate a first set of scan chain output signals that change based on a rising edge of the first clock signal and a second set of scan chain output signals that change based on a falling edge of the first clock signal.

In other features, the scan chains generate a first data signal and a second data signal, which overlaps the first data signal in time. In other features, a first portion of the scan chains ends with a positive edge element and a second portion of the scan chains ends with a negative edge element. In other features, a control module is included that transmits test data to the scan chains and monitors the tester outputs.

In other features, each of the scan chains includes serially coupled state variable devices. In other features, the state variable devices include flip-flops. In other features, a combinational logic circuit is included and coupled between adjacent ones of the scan chains.

In still other features, the scan chains include a first set of scan chains that include a first set of state variable devices that receive the first clock signal and a second set of scan chains that include a second set of state variable devices that receive an inversion of the first clock signal. In other features, the sampling circuit captures data output from the first and second sets of state variable devices. In other features, a compressor is included that receives and compresses data output from the first and second sets of state variable devices to generate the output test data.

In other features, a second clock is included that generates a second clock signal that is out of phase with the first clock signal. The sampling circuit samples each of the tester outputs at least twice per clock cycle of the second clock signal. In other features, the sampling circuit samples each of the tester outputs four times per clock cycle of the first clock signal and per clock cycle of the second clock signal.

In yet other features, the scan chains include first, second, third, and fourth sets of scan chains. The first set of scan chains includes a first set of flip-flops that receive the first clock signal. The second set of scan chains includes a second set of flip-flops that receive the second clock signal. The third set of scan chains includes a third set of flip-flops that receive an inversion of the first clock signal. The fourth set of scan chains includes a fourth set of flip-flops that receive an inversion of the fourth clock signal. In other features, the sampling circuit captures data output from the first, second, third and fourth sets of associated flip-flops. In other features, a compressor is included that receives data output from the first, second, third and fourth sets of associated flip-flops and that generates the output test data based thereon.

In other features, each clock cycle of the first clock signal includes first and second edges. The first and second edges include rising and/or falling edges. The sampling circuit captures data on each of the tester outputs based on the first and second edges. In other features, the tester inputs receive an unknown signal (X). The scan test circuit further includes a compressor that masks a tester output of the tester outputs based on the first edge and the unknown signal (X). The tester outputs receive unmasked data from the compressor based on the second edge. In other features, the tester inputs receive an unknown signal (X). The scan test circuit further includes a control module that masks a tester output of the tester outputs based on the first edge and the unknown signal (X). The tester outputs receive unmasked data from the compressor based on the second edge. In other features, the control module detects a fault of the scan test circuit based the output test data and the second edge.

In further features, the tester inputs receive an unknown signal (X). The scan test circuit further includes a compressor that masks a tester output of the tester outputs based on the first clock signal and the unknown signal (X). The tester outputs receive unmasked data from the compressor based on a second clock signal that overlaps the first clock signal in time.

In other features, a decompressor is included and coupled between the tester inputs and the scan chains. A compressor is coupled between the input tester chains and the tester outputs.

In other features, a scan-based system is provided and includes the scan test circuit and further includes a memory that stores at least one of the scan test data and the output test data. A control module is coupled to the tester inputs, the sampling circuit, and the memory. The control module operates scan test software to generate the scan test data and monitors the scan test circuit for faults based on the output test data.

In other features, a method of performing a scan test on a circuit under test (CUT) is provided and includes receiving scan test data from tester inputs that are coupled to scan chains. Output test data is provided based on the scan test data via tester outputs that are coupled to the scan chains. A first clock signal is generated. Each of the tester outputs is sampled at least twice per clock cycle of the first clock signal. In other features, scan chain output signals are generated that are offset from each other in time via the scan chains.

In still other features, a first set of scan chain output signals is generated that change based on a rising edge of the first clock signal. A second set of scan chain output signals is generated that change based on a falling edge of the first clock signal. In other features, a first data signal and a second data signal, which overlaps the first data signal in time, are generated via the scan chains. In other features, test data is transmitted to the scan chains. The tester outputs are monitored.

In other features, the first clock signal is received via a first set of state variable devices of a first set of the scan chains. An inversion of the first clock signal is received via a second set of state variable devices of a second set of the scan chains. In other features, data output from the first and second sets of state variable devices is captured. In other features, data output from the first and second sets of state variable devices is received and compressed to generate the output test data.

In yet other features, a second clock signal that is out of phase with the first clock signal is generated. Each of the tester outputs is sampled at least twice per clock cycle of the second clock signal. In other features, each of the tester outputs is sampled four times per clock cycle of the first clock signal and per clock cycle of the second clock signal. In other features, the first clock signal is received via a first set of flip-flops of a first set of the scan chains. The second clock signal is received via a second set of flip-flops of a second set of the scan chains. An inversion of the first clock signal is received via a third set of flip-flops of a third set of the scan chains. An inversion of the second clock signal is received via a fourth set of flip-flops of a fourth set of the scan chains. In other features, data output from the first, second, third and fourth sets of associated flip-flops is captured. In other features, data output from the first, second, third and fourth sets of associated flip-flops is received and the output test data is generated based thereon.

In further features, data on each of the tester outputs is captured based on first and second edges of each clock cycle of the first clock signal. The first and second edges include rising and/or falling edges. In other features, an unknown signal (X) is received. A tester output of the tester outputs is masked based on the first edge and the unknown signal (X) via a compressor. Unmasked data is received from the compressor based on the second edge via the tester outputs. In other features, an unknown signal (X) is received. A tester output of the tester outputs is masked based on the first edge and the unknown signal (X) via a control module. Unmasked data is received from the control module based on the second edge via the tester outputs. In other features, a fault of the scan test circuit is detected based on the output test data and the second edge.

In other features, an unknown signal (X) is received. A tester output of the tester outputs is masked based on the first clock signal and the unknown signal (X) via a compressor. Unmasked data from the compressor is received based on a second clock signal that overlaps the first clock signal in time.

In other features, at least one of the scan test data and the output test data is stored. The scan test data is generated via scan test software. The scan test circuit is monitored for faults based on the output test data.

In still other features, a scan test circuit is provided and includes tester input means for receiving scan test data. Scan chain means for communicating with the tester input means is included. Tester output means for communicating with the scan chain means and for providing output test data based on the scan test data is also included. First clock means for generating a first clock signal is further included. Sampling means for sampling each tester output of the tester output means at least twice per clock cycle of the first clock signal as also included. In other features, the scan chain means generates scan chain output signals that are offset from each other in time.

In yet other features, the scan chain means generates a first set of scan chain output signals that change based on a rising edge of the first clock signal and a second set of scan chain output signals that change based on a falling edge of the first clock signal. In other features, the scan chain means generates a first data signal and a second data signal, which overlaps the first data signal in time. In other features, a first portion of the scan chain means ends with a positive edge element and a second portion of the scan chain means ends with a negative edge element.

In further features, control means for transmitting test data to the scan chain means and for monitoring the tester outputs is included. In other features, each scan chain of the scan chain means includes serially coupled state variable devices. In other features, the state variable devices include flip-flops. In other features, a combinational logic circuit is included and coupled between adjacent scan chains of the scan chain means.

In other features, the scan chain means includes a first set of scan chains that include a first set of state variable devices that receive the first clock signal. The scan chain means also includes a second set of scan chains that include a second set of state variable devices that receive an inversion of the first clock signal. In other features, the sampling means captures data output from the first and second sets of state variable devices. In other features, the compressing means receives and compresses data output from the first and second sets of state variable devices to generate the output test data.

In other features, second clock means for generating a second clock signal that is out of phase with the first clock signal is included. The sampling means samples each of the tester outputs at least twice per clock cycle of the second clock signal. In other features, the sampling means samples each of the tester outputs four times per clock cycle of the first clock signal and per clock cycle of the second clock signal.

In still other features, the scan chain means includes first, second, third, and fourth sets of scan chains. The first set of scan chains includes a first set of flip-flops that receive the first clock signal. The second set of scan chains includes a second set of flip-flops that receive the second clock signal. The third set of scan chains includes a third set of flip-flops that receive an inversion of the first clock signal. The fourth set of scan chains includes a fourth set of flip-flops that receive an inversion of the second clock signal. In other features, the sampling means captures data output from the first, second, third and fourth sets of associated flip-flops. In other features, compressing means for receiving data output from the first, second, third and fourth sets of associated flip-flops and for generating the output test data based thereon is included.

In yet other features, each clock cycle of the first clock signal includes first and second edges. The first and second edges include rising and/or falling edges. The sampling means captures data on each tester output of the tester output means based on the first and second edges. In other features, the tester input means receives an unknown signal (X). The scan test circuit further includes compressing means for masking a tester output of the tester output means based on the first edge and the unknown signal (X). The tester output means receives unmasked data from the compressing means based on the second edge. In other features, the tester input means receives an unknown signal (X). The scan test circuit further includes control means for masking a tester output of the tester output means based on the first edge and the unknown signal (X). The tester output means receives unmasked data from the control module based on the second edge. In other features, the control means detects a fault of the scan test circuit based the output test data and the second edge.

In further features, the tester input means receives an unknown signal and the unknown signal (X). The scan test circuit further includes compressing means for masking a tester output of the tester output means based on the first clock signal. The tester output means receives unmasked data from the compressing means based on a second clock signal that overlaps the first clock signal in time.

In other features, a decompressor is included and coupled between the tester input means and the scan chain means. A compressor is coupled between the scan chain means and the tester output means.

In other features, a scan-based system is provided and includes the scan test circuit and further includes storing means for storing at least one of the scan test data and the output test data. Control means for communicating with the tester input means, the sampling means, and the storing means is included. The control means operates scan test software to generate the scan test data and monitors the scan test circuit for faults based on the output test data.

In still other features, a computer readable medium is provided that stores a computer program for performing a scan test on a circuit under test (CUT). The computer program includes code that performs the steps of: generating scan test data for tester inputs that are coupled to scan chains; receiving output test data based on the scan test data via tester outputs that are coupled to the scan chains; generating a first clock signal; and sampling each of the tester outputs at least twice per clock cycle of the first clock signal. In other features, the steps include receiving scan chain output signals that are offset from each other in time via the scan chains.

In other features, the steps include receiving a first set of scan chain output signals that change based on a rising edge of the first clock signal. The steps further include receiving a second set of scan chain output signals that change based on a falling edge of the first clock signal. In other features, the steps include receiving a first data signal and a second data signal, which overlaps the first data signal in time via the scan chains. In other features, the steps further include transmitting test data to the scan chains and monitoring the tester outputs.

In yet other features, the steps include generating the first clock signal for reception by a first set of state variable devices of a first set of the scan chains. The steps further include generating an inversion of the first clock signal for reception by a second set of state variable devices of a second set of the scan chains. In other features, the steps further include capturing data output from the first and second sets of state variable devices. In other features, the steps further includes receiving and compressing data output from the first and second sets of state variable devices to generate the output test data.

In other features, the steps further include generating a second clock signal that is out of phase with the first clock signal and sampling each of the tester outputs at least twice per clock cycle of the second clock signal. In other features, the steps include sampling each of the tester outputs four times per clock cycle of the first clock signal and per clock cycle of the second clock signal.

In further features, the steps include: generating the first clock signal for reception by a first set of flip-flops of a first set of the scan chains; generating the second clock signal for reception by a second set of flip-flops of a second set of the scan chains; generating an inversion of the first clock signal for reception by a third set of flip-flops of a third set of the scan chains; and generating an inversion of the second clock signal for reception by a fourth set of flip-flops of a fourth set of the scan chains. In other features, the steps include capturing data output from the first, second, third and fourth sets of associated flip-flops.

In other features, the steps further include capturing data on each of the tester outputs based on first and second edges of each clock cycle of the first clock signal. The first and second edges include rising and/or falling edges. In other features, the steps further include masking a tester output of the tester outputs based on the first edge and generating unmasked data based on the second edge for reception by the tester outputs. In other features, the steps further include detecting a fault of the scan test circuit based the output test data and the second edge.

In other features, the steps further include storing at least one of the scan test data and the output test data. The steps further include generating the scan test data via scan test software and monitoring the scan test circuit for faults based on the output test data.

In still other features, the systems and methods described above are implemented by a computer program executed by one or more processors. The computer program can reside on a computer readable medium such as but not limited to memory, non-volatile data storage and/or other suitable tangible storage mediums.

Further areas of applicability of the present disclosure will become apparent from the detailed description provided hereinafter. It should be understood that the detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

DETAILED DESCRIPTION

Figure 1:
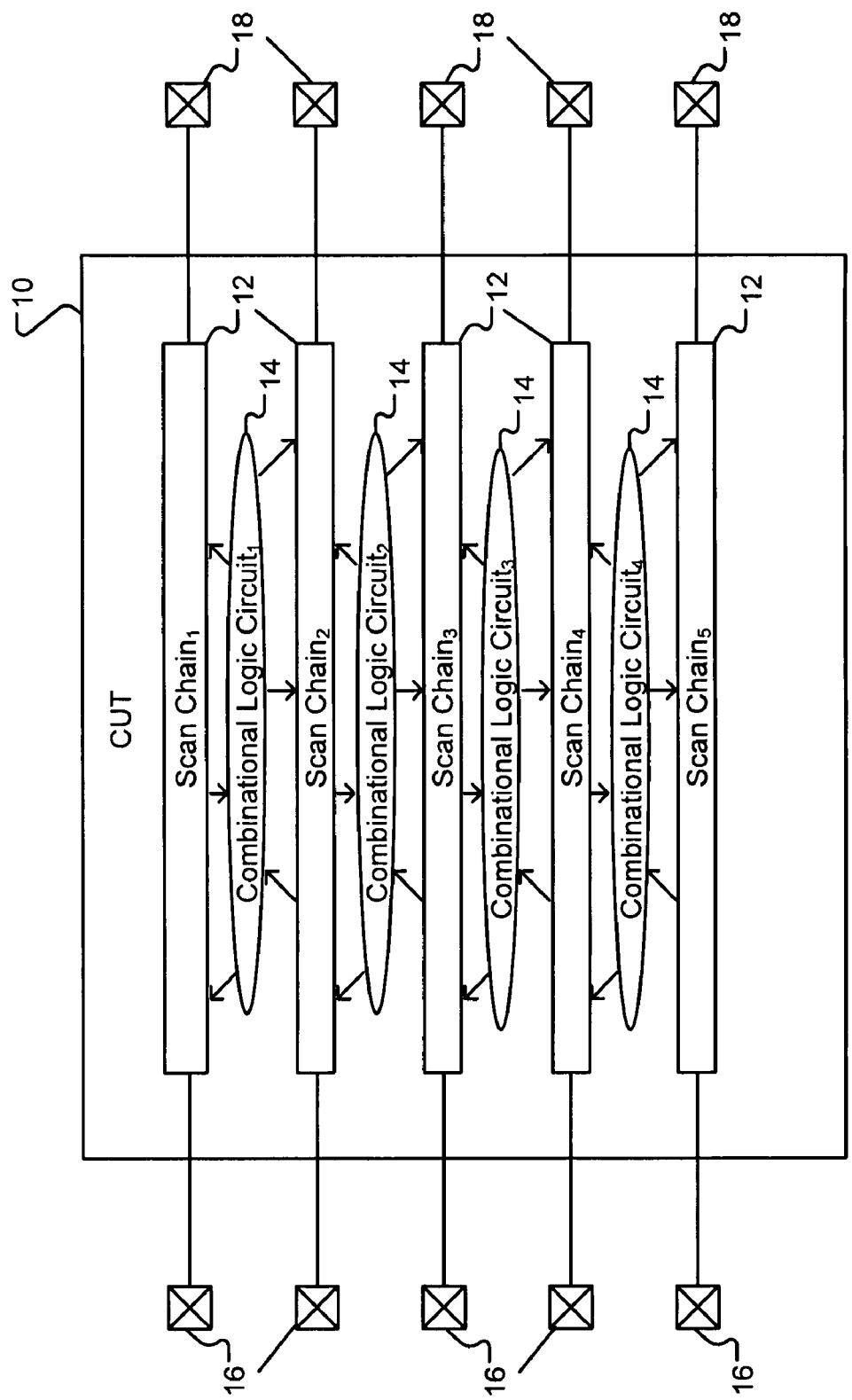
FIG. 1 is a functional block diagram of a circuit under test (CUT) that includes a traditional parallel scan chain configuration.

The following description is merely exemplary in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical or. It should be understood that steps within a method may be executed in different order without altering the principles of the present disclosure.

As used herein, the term module refers to an Application Specific Integrated Circuit (ASIC), an electronic circuit, a processor (shared, dedicated, or group) and memory that execute one or more software or firmware programs, a combinational logic circuit, and/or other suitable components that provide the described functionality.

The below described embodiments provide different techniques that may be used separately or in combination to decrease X-density of a circuit under test (CUT). A CUT may be an IC, an ASIC, or other circuit.

Figure 2:
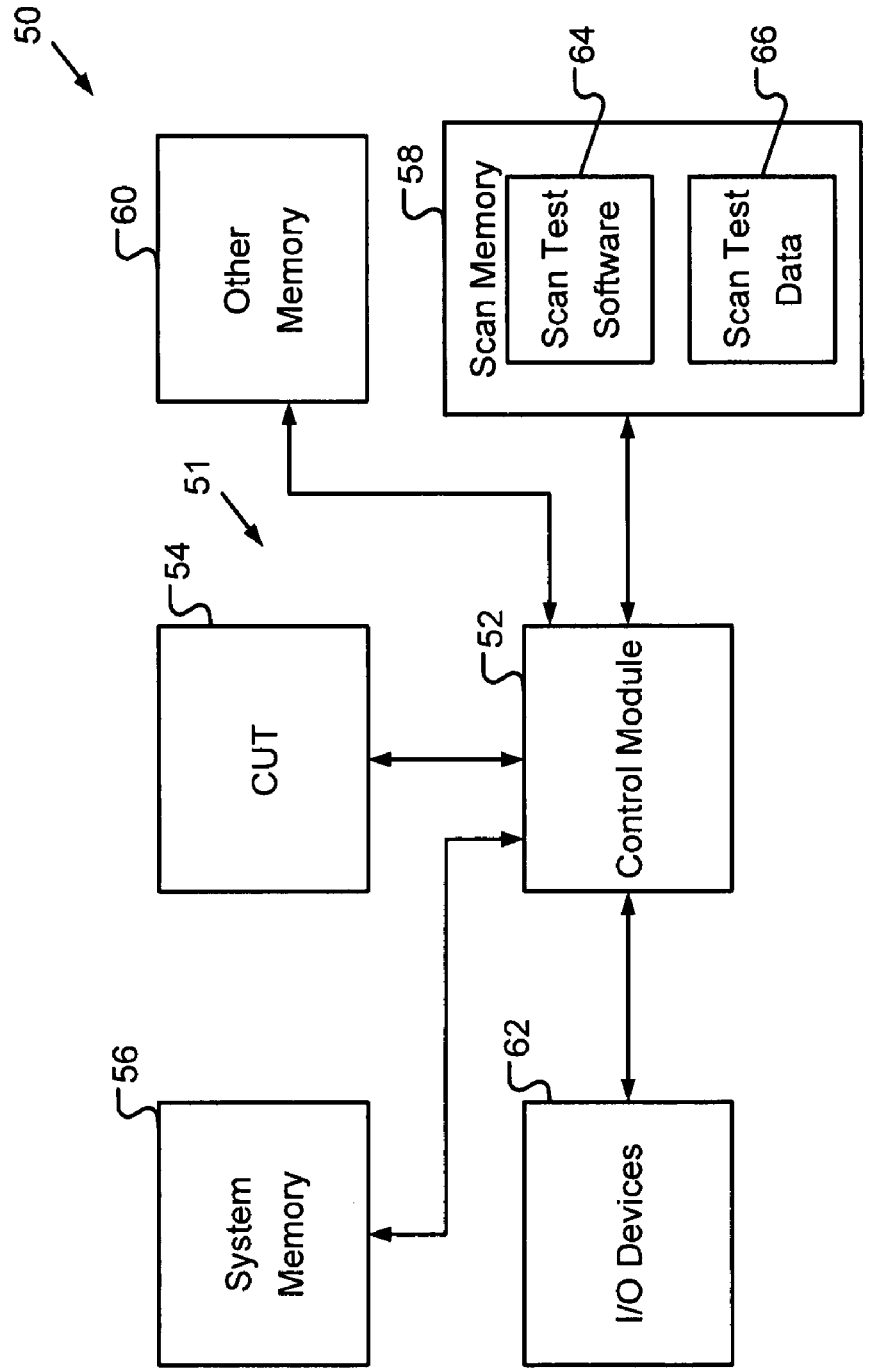
FIG. 2 is a functional block diagram of a scan-based testing system.

Referring to FIG. 2, a functional block diagram of a scan-based testing system 50 is shown. The scan-based testing system 50 includes a scan test circuit 51 with a control module 52, which is coupled to a CUT 54. The scan-based testing system 50 may also include a system memory 56, a scan memory 58, other memory 60 and input/output (I/O) devices 62. The system memory 56 may include, for example, operating system software. The scan memory 58 may include scan test software 64 and scan test data 66. The input/output (I/O) devices 62, for example, may include a keyboard, a mouse, a trackball, a printer, a display, a network connection, etc.

Portions of the embodiments of the present disclosure may be implemented in software instructions, which may be stored in the system memory 56, the scan memory 58 and/or the other memory 60. The memories 56-60 may include a hard disk drive, a random access memory (RAM), a read only memory (ROM), a flash memory, or other memory. The software instructions may also be stored in removable or remote media, such as memory cards, compact disks, floppy disks, etc., which may be communicated with via one of the I/O devices 62. The software instructions may also be received from and/or transmitted to a computer system via one of the I/O devices 62.

Figure 3:
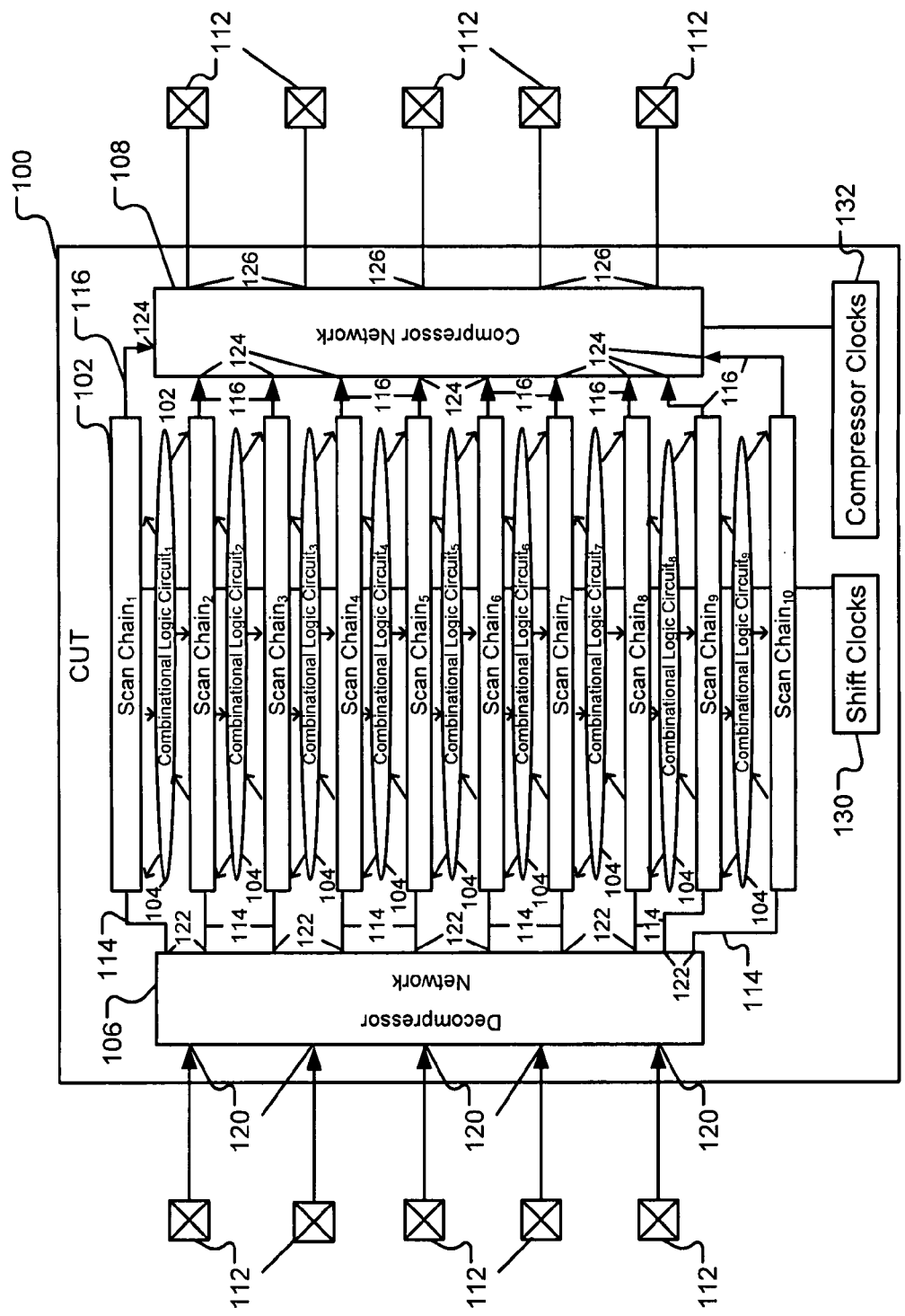
FIG. 3 is a functional block diagram of a CUT that includes a decompress/compress parallel scan chain configuration.

Referring to FIG. 3, a functional block diagram of a CUT 100 that includes a decompress/compress parallel scan chain configuration is shown. The CUT 100 includes parallel configured scan chains 102, which have associated combinational logic circuits 104. The combinational logic circuits 104 are coupled between the scan chains 102. The CUT 100 also includes a decompressor network 106, a compressor network 108 and multiple scan input (Scan_In) and scan output (Scan_Out) tester pins 110, 112. The pins 110,112 may be referred to inputs and outputs, respectively. The decompressor network 106 decompresses data from the Scan_In pins 110 to provide scan chain input signals 114. The compressor network 108 compresses scan chain output signals 116 prior to reception by the Scan_Out pins 112. Scan test data, which may be referred to as control data, is provided to the Scan_In pins 112. Output of the scan chains 102 is monitored in a compressed format via the Scan_Out pins 112.

The scan chains 102 may include state variable devices, such as flip-flops, and other state viable devices. The combinational logic circuits 104 may include any number and combination of memory elements, sequential logic devices and/or logic gates.

For the example shown, the CUT 100 includes five (5) Scan_In pins and 5 Scan_Out pins. The decompressor network 106 has a corresponding input/output ratio of 1:2. The compressor network 108 has a corresponding input/output ratio of 2:1. Thus, the CUT 100 includes ten (10) scan chain inputs and 10 scan chain outputs. The decompressor and compressor networks 106, 108 may have any associated decompression and compression ratios.

In the example shown, the decompressor network 106 has five decompressor inputs 120 and ten decompressor outputs 122. The decompressor network 106 may be based on a linear feedback shift register (LFSR) network and include exclusive-OR gates (XOR). The decompressor 106 may operate in multiple modes including pseudorandom and deterministic modes. In the pseudorandom mode, a pseudorandom pattern generator (PRPG) may be used to generate test vectors. In the deterministic mode, variable-length seeds may be serially scanned through a boundary-scan interface into the PRPG and parts of internal scan chains. Subsequently, a decompression may be performed in parallel via the PRPG and selected scan flip-flops that are interconnected to form a decompression device.

In the example shown, the compressor network 108 has ten compressor inputs 124 and five compressor outputs 126. The compressor network 108 may include logic devices, capture devices, latch devices, sampling devices, and other devices. As an example, the compressor network 108 may include a network of XOR gates for compression, as well as flip-flops and latches to sample the scan chain output signals.

The CUT 100 may also include shift clocks 130 and compressor clocks 132, which may be synchronized with the shift clocks 130. The shift clocks 130 are used to coordinate shifting of data in and out of the scan chains 102. The compressor clock 132 may be used to capture data from the scan chains 102.

The configuration of FIG. 3, provides a reduced number of scan chains. The reduced number of scan chains decreases overall scan chain length and reduces scan test time.

Figure 4:
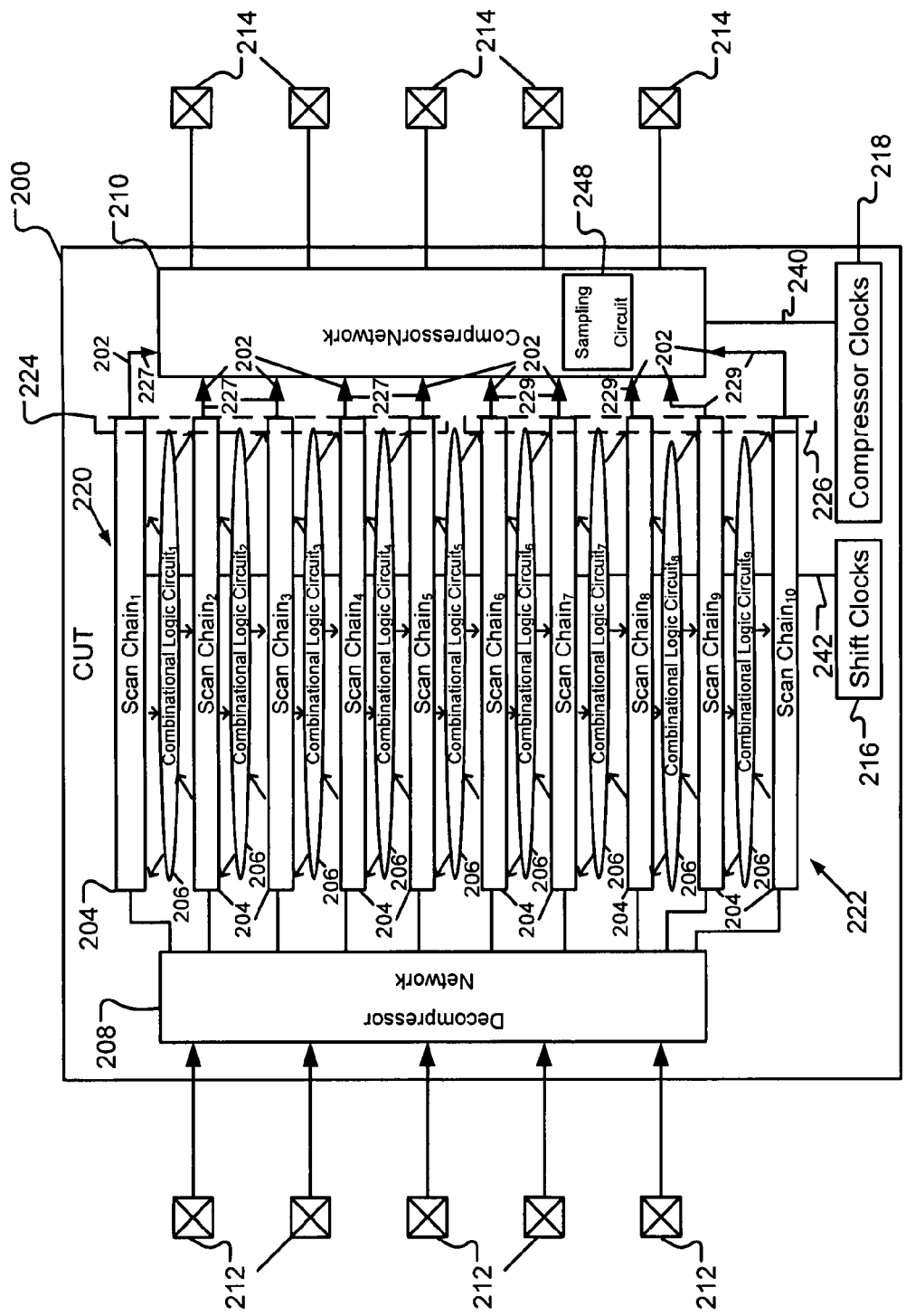
FIG. 4 is a functional block diagram of a CUT that includes a decompress/compress parallel scan chain configuration with shifted scan chain output signals in accordance with an embodiment of the present disclosure.

Referring to FIG. 4, a functional block diagram of a CUT 200 that includes a decompress/compress parallel scan chain configuration with shifted scan chain output signals 202 is shown. The CUT 200 includes multiple parallel configured scan chains 204. As with the scan chains 102, the scan chains 204 have associated combinational logic circuits 206. The combinational logic circuits 206 are coupled between the scan chains 204. The CUT 200 also includes a decompressor network 208, a compressor network 210 and multiple scan input (Scan_In) and scan output (Scan_Out) tester pins 212, 214. The CUT 200 may also include shift clocks 216 and one or more compressor clocks 218.

The scan chains 204 include a first set of scan chains 220 and a second set of scan chains 222. The last state variable device within each of the scan chains of the first set of scan chains 220 is a positive sequential element. The last scan chain elements of the first set of scan chains 220 is designated by dashed box 224. A positive sequential element refers to an element that responds to a rising edge of a clock signal. When a positive sequential element is not available for use as a last state variable device, a positive edge lock-up latch or a lock-up flip-flop may be used. The lock-up elements affect scan shifting of data and do not affect functionality of the CUT. The last state variable device within each of the scan chains of the second set of scan chains 222 is a negative sequential element. The last scan chain elements of the second set of scan chains 222 is designated by dashed box 226. A negative sequential element refers to an element that responds to a falling edge of a clock signal. When a negative sequential element is not available for use as a last state variable device, a negative edge lock-up latch, or lock-up flip-flop may be used.

When the scan chains 204 are configured to respond based on a common shift or compressor clock signal, scan chain output signals 227 of the second set of scan chains 222 are offset in time from scan chain output signals 229 of the first set of scan chains 220. Thus, data from the second set of scan chains 222 is staggered and/or overlaps data from the first set of scan chains 220 in time. The term overlap refers to portions of two or more separate signals or signal pulses that exist at the same time. The compressor clock signals 218 may be the same as the shift clock signals 216. Although shown as receiving compressor clock signals 240 from the compressor clocks 218, the compressor network 210 may receive shift clock signals 242 from the shift clocks 216. The compressor network 210 may operate based off of the shift clock signals 242 and not the compressor clock signals 240

Although two sets of scan chains are shown in FIG. 4, any number of scan chain sets may be incorporated. Also, each scan chain set may have any number of scan chains.

The compressor network 210 includes a sampling circuit 248 that receives and samples the scan chain output signals 202. The sampling circuit 248 may oversample, or in other words, sample each of the scan chain output signals 248 at least twice per clock cycle (a data sampling ratio of greater than or equal to 2:1). Examples of 2s (sampling twice per clock cycle) and 4s (sampling four times per clock cycle) sampling rate implementations are shown in the timing diagrams of FIGS. 5 and 7.

The combination of the scan chain output signals 202 being offset in time and the oversampling of the scan chain output signals 202 allows for data to be captured, latched, and monitored that may have otherwise been masked and/or rendered useless.

Figure 5:
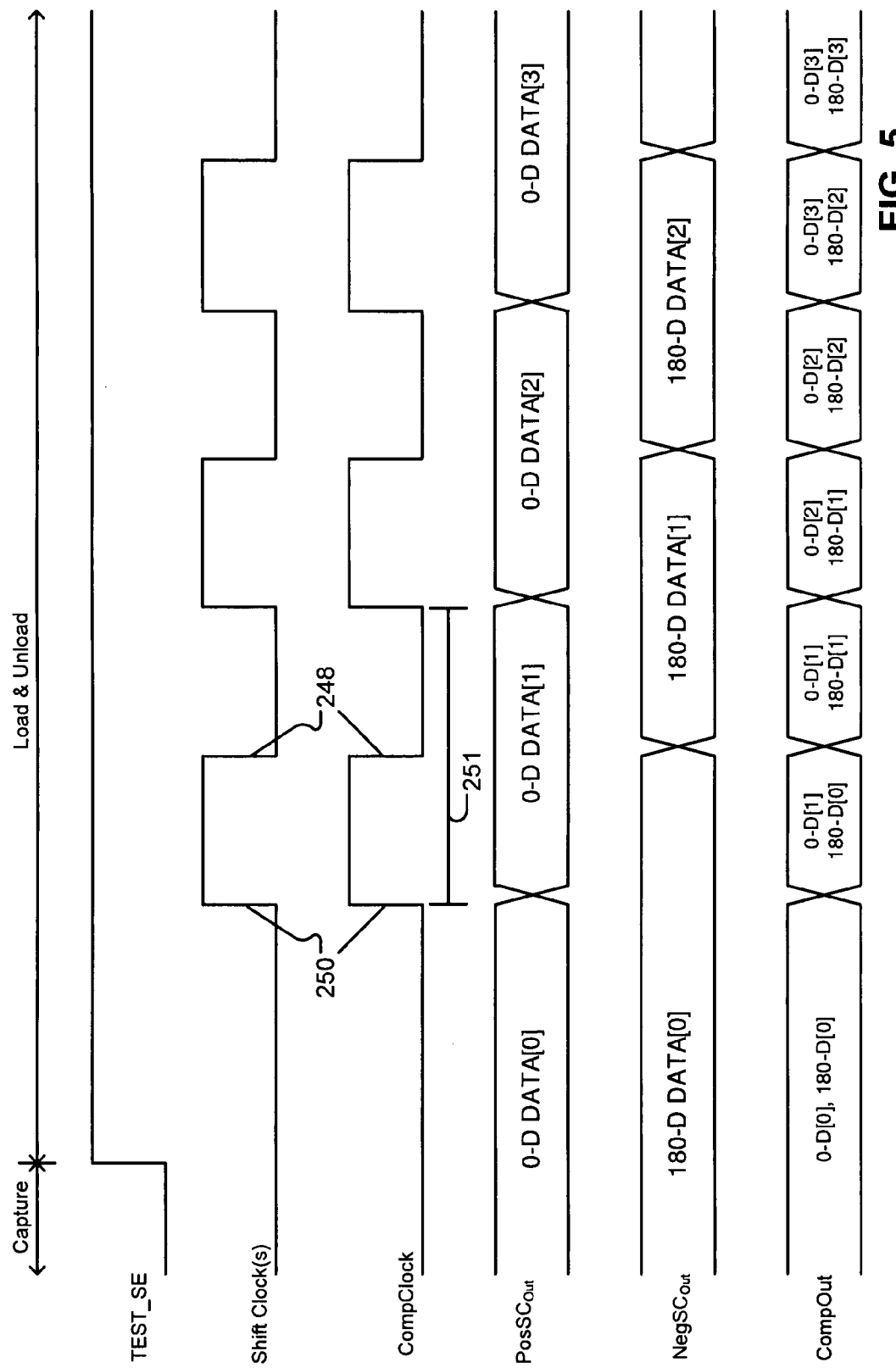
FIG. 5 is a sample timing diagram illustrating overlapping and increased sampling of scan chain data output signals in accordance with an embodiment of the present disclosure.

Referring also to FIG. 5, a sample timing diagram that illustrates overlapping and increased sampling of scan chain data output signals is shown. The overlapping and increased sampling of scan chain data output signals provides an increased amount of data samples, which effectively reduces X-density associated with a CUT.

X-density refers to a number of unknown data samples divided by a number of shifts that occur during a load and unload sequence of scan chains. As an example, using the (1s) configuration of FIG. 3, when there is an average of Xs in a CUT of 100, with 1000 shifts during a load and unload sequence, the X-density may be 0.1 for the associated compressor network. With the multiple sample (2s) compressor scheme of FIG. 4, the number of shift samples doubles. As a result, the X-density of the compressor network is up to 50% less than that of the compressor network of FIG. 3. The reduction in X-density is provided without an increase in test time.

The timing diagram of FIG. 5 includes a test enable signal TEST_SE, shift clock signals Shift Clock(s), a compressor clock signal CompClock, a positive edge scan chain signal $PosSC_{Out}$, a negative edge scan chain signal $NegSC_{Out}$, and a compressed signal CompOut. The test enable signal TEST_SE may be provided by the control module 52 of FIG. 2. The shift clock signals Shift Clock(s) may be provided by the shift clocks 216. The compressor clock signal Comp-Clock may be provided by the compressor clocks 218. The positive edge scan chain signal $PosSC_{Out}$ may be provided by the first set of scan chains 220. The negative edge scan chain signal $NegSC_{Out}$ may be provided by the second set of scan chains 222. The compressed signal CompOut represents output test data signals on the output tester pins 214. Each of the positive edge scan chain signal $PosSC_{Out}$, the negative edge scan chain signal $NegSC_{Out}$ and the compressor signal CompOut include five bit samples of data; one from each of the corresponding scan chain output signals 202 or output tester pins 214.

Note that for the embodiment shown, that there are two data set samples for the duration of each data set. For example, data set samples 0-D[1]/180-D[0] and O-D[1]/180-D[1] are gathered during the duration of data set 0-D DATA [1]. Thus, should there be an X (unknown) associated with the data set 180-D DATA[0] when one or more of the clock signals Shift Clock(s), CompClock are high, the data set 0-D DATA[1] may be sampled upon falling edges 248 of one or more of the clock signals, as designated by data set sample O-D[1]/180-D[1]. This allows for faults or proper data to be detected that would otherwise be masked.

When entering a load and unload phase, the shift and compressor clocks 216, 218 are in an OFF state, such as a logic 0. The compressor network 210 outputs data from the first and second set of scan chains 220, 222, represented by signals $PosSC_{Out}$, $NegSC_{Out}$, respectively. Output of the first and second set of scan chains 220, 222 during the initial OFF state is provided by data sets O-D DATA[0] and 180-D DATA [0]. A first sample of the output tester pins 214 is taken, which includes data set samples O-D[0] and 180-D[0]. The shift and compressor clock signals 242, 240 may then switch to an active state, such as transitioning from a LOW state to a HIGH state. This transition is shown by rising edges 250, which changes output data on the first set of scan chains 220. Another sample is then taken, which includes data set samples O-D[1] and 180-D[0]. The two samples of data are thus taken during one clock cycle. Since the two samples are gathered in one clock cycle, test time is not increased.

A clock cycle refers to a single cycle of transition states of a clock signal. As a square wave, a clock cycle generally includes a single rising edge, a single falling edge, a single HIGH state and a single LOW state. An example of a clock cycle is designated 251.

With two samples per clock cycle, X-density is reduced. For the configuration of FIG. 4, the Xs may be split between the first and second sets of scan chains 220, 222. This split may be even such that when there are 100 Xs, 50 Xs may be provided to the first set of scan chains 220 and the other 50 Xs may be provided to the second set of scan chains 222. Since the number of samples is doubled, for example 1000 to 2000, the number of shift cycles is doubled to 2000. Thus, the X-density of the compressor network 210 is 100/2000, or 0.05. The X-density is reduced by 50% over the 1s configuration of FIG. 3. Note that the Xs may not be evenly split, and the X-density can be different for the first and second sets of scan chains 220, 222. Nevertheless, distribution of the Xs may be managed by stitching a chain to balance the X's between the first and second sets of scan chains 220, 222.

As another 2s sample rate example, a 0° shift clock and an inversion of that shift clock, a 180° shift clock, may be used. The two shift clock signals may be provided to two different sets of parallel scan chains. The two sets of scan chains may both respond to either rising or to falling edges of a clock signal. The 0° shift clock signal may be provided to a first set of scan chains and the 180° shift clock signal may be provided to a second set of scan chains. Thus, scan chain output signals are shifted due to reception of two different clock signals, as opposed to use of positive and negative state variables.

In the above examples, 2s sampling rates are used. Other sampling rates may be used such as 4s, 8s, 16s, etc. For a sampling rate above 2s, additional clock signals may be generated to collect additional samples. The additional clock signals may be generated internal or external to a CUT. The additional clock signals may also be skewed or have different phases.

Figure 6:
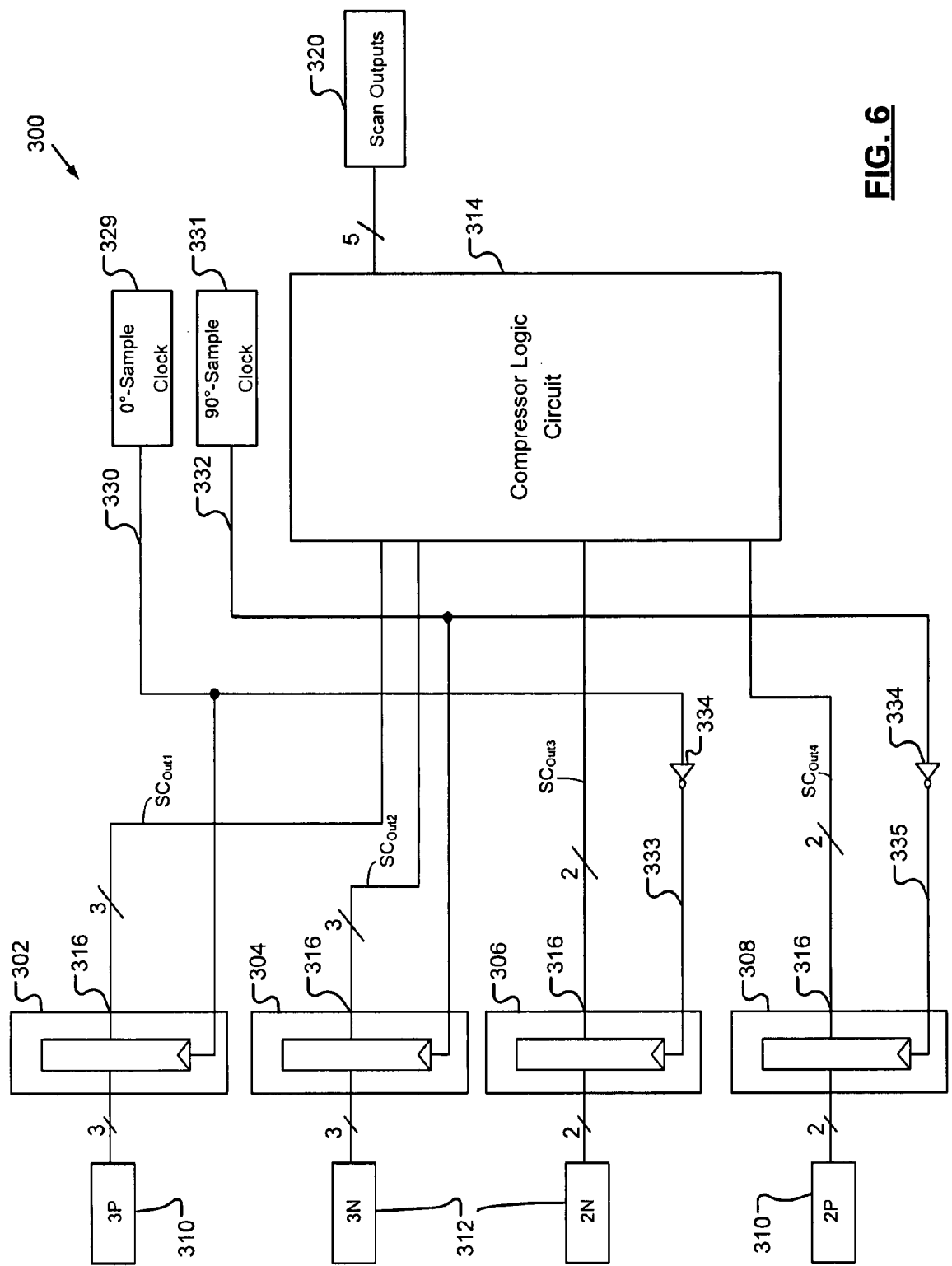
FIG. 6 is a functional block diagram of a compressor circuit portion of a CUT for a parallel scan chain configuration in accordance with another embodiment of the present disclosure.

Referring to FIG. 6, a functional block diagram of a compressor circuit portion 300 of a CUT for a parallel scan chain configuration is shown. The embodiment of FIG. 6 is directed to a 4s sample rate configuration, but may be modified for other sample rates. The compressor circuit portion 300 includes four sets of flip-flops 302, 304, 306, 308. The flip-flops 302, 304, 306, 308 are coupled in parallel and between first and second sets of scan chains 310, 312 and a compressor logic circuit 314. Captured outputs 316 of the flip-flops 302, 304, 306, 308 are provided to the compressor logic circuit 314. Each of the first and second sets of scan chains 310, 312 has five scan chains, designated 3P, 2P and 2N, 3N, respectively. The compressor logic circuit 314 has five output tester pins 320. The compressor logic circuit 314 may have a compression ratio of 2:1, as shown, or some other compression ratio.

The first set of flip-flops 302 is coupled to the three positive scan chains 3P. The second set of flip-flops 304 is coupled to the three negative scan chains 3N. The third set of flip-flops 306 is coupled to the two remaining positive scan chains 2P. The fourth set of flip-flops 308 is coupled to two remaining negative scan chains 2N.

For a 4s sample rate, a 0° clock signal 330 may be generated in addition to a 90° clock signal 332. The clock signals 330, 332 may be generated by a 0° clock signal 329 and a 90° clock signal 331. When more then one shift clock is used, then a first shift clock can provide the 0° clock signal and a second shift clock can provide the 90° clock signal. The inverse of the 0° clock signal and the 90° clock signal respectively provides a 180° clock signal 333 and a 270° clock signal 335. The 180° clock signal 333 and the 270° clock signal 335 may be generated via the use of inverters 334. The 0° clock signal 330 and the 90° clock signal 332 may be generated internal or external to the CUT. Thus, the first set of flip-flops 302 receives the 0° clock signal 330. The second set of flip-flops 304 receives the 90° clock signal 332. The third set of flip-flops 306 receives the 180° clock signal 333. The fourth set of flip-flops 308 receives the 270° clock signal 335. The described clock signals and the generation thereof is provided as an example only, the clock signals may be generated using other techniques.

Figure 7:
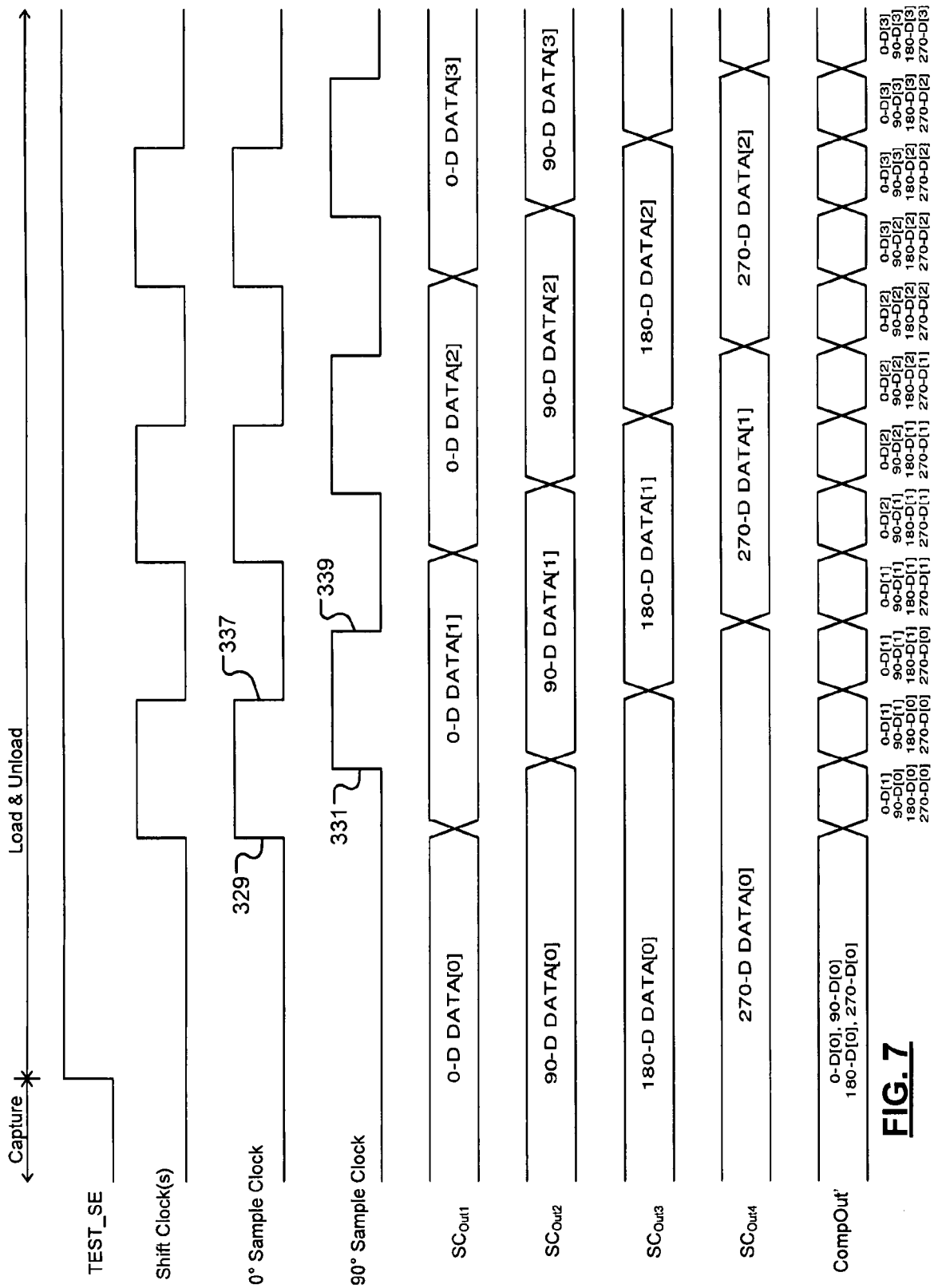
FIG. 7 is a sample timing diagram for the compressor circuit portion of FIG. 6 in accordance with another embodiment of the present disclosure.

Referring also to FIG. 7, a sample timing diagram for the compressor circuit portion 300 is shown. The timing diagram includes the test enable signal TEST_SE, the shift clock signals ShiftClock(s) and one or more compressor clock signals, such as the 0° sample clock signal 330 and the 90° sample clock signal 332. The timing diagram also includes scan chain output signals $SC_{Out1}$, $SC_{Out2}$, $SC_{Out3}$, $SC_{Out4}$ and a compressor signal CompOut. Note that each data set, such as data sets O-D DATA[1], 90-D DATA[1], 180-D DATA[1], and 270-D DATA[1] may be sampled four times. Thus, should an X be associated with, for example one or more of the data sets O-D DATA[1], 90-D DATA[1], 180-D DATA[1], there are four chances that the data in the data set 270-D DATA[1] is captured.

The 4s sample rate example has a 25% X-density as compared with the above-described 1s example. The Xs for the 4s embodiment may be evenly split. Continuing from the above X-density example where 100 Xs are generated in association with a CUT, the Xs may be provided to the scan chains 310, 312. 25 Xs may be received by each of the four sets of flip-flops 302, 304, 306, 308. Since the sample rate is quadrupled, 4000 samples are taken and the number of shift cycles is 4000. Therefore the X-density is 100/4000, which is equal to 0.025. Again, note that the Xs may not be evenly split, and the X-density can be different for each of the sets of flip-flops 302, 304, 306, 308 and corresponding scan chains 310, 312. Distribution of the Xs can be managed by stitching a chain to balance the X's between the sets of flip-flops 302, 304, 306, 308.

Figure 8:
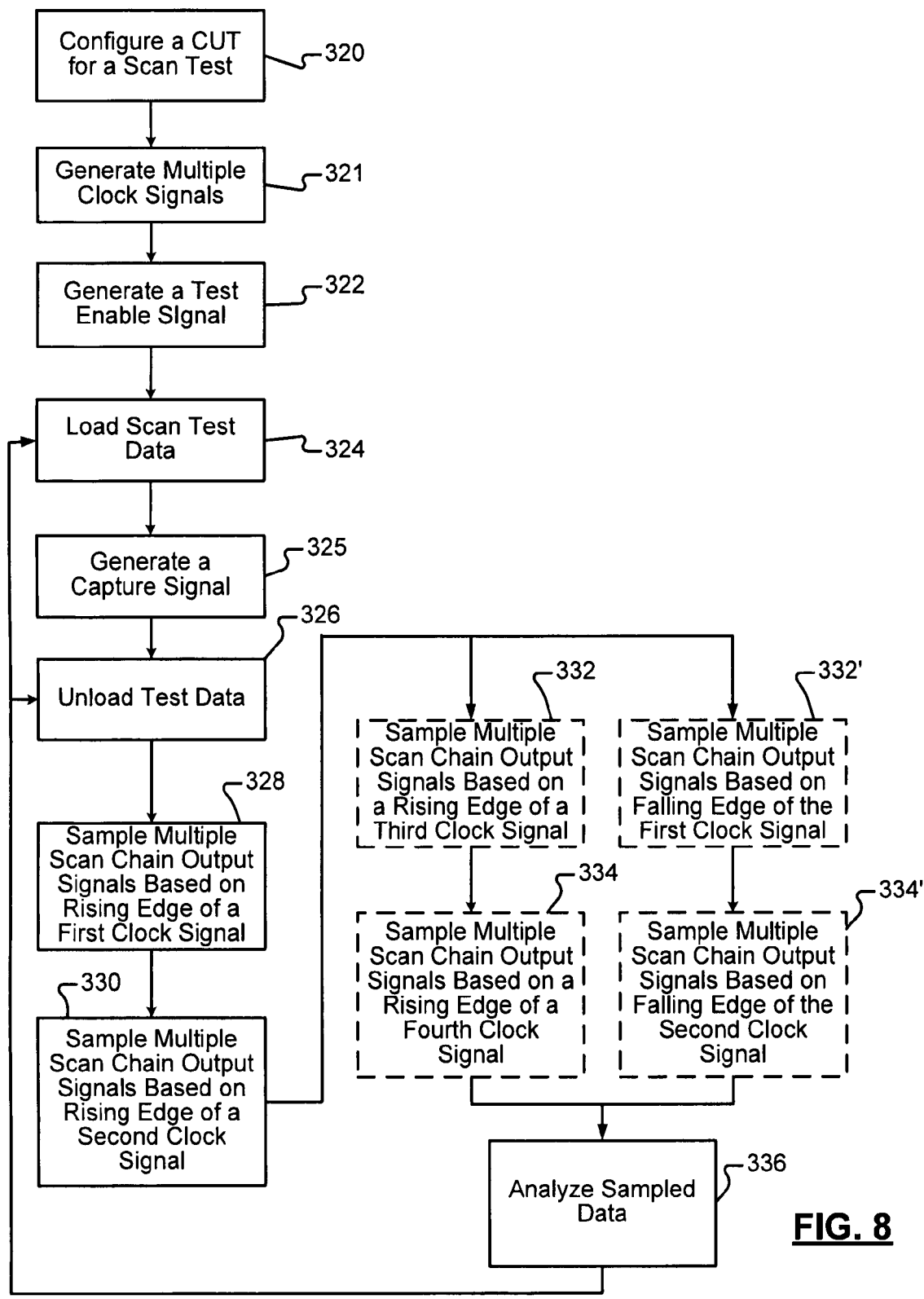
FIG. 8 is a flow diagram illustrating a method of performing a scan-based test in accordance with an embodiment of the present disclosure.

Referring to FIG. 8, a flow diagram illustrating a method of performing a scan-based test in accordance with an embodiment of the present disclosure is shown. Although the following steps are described primarily with respect to the embodiments of FIGS. 4-7, the steps may be modified to apply to other embodiments of the present invention.

In step 320, a CUT is configured for a scan test. State variable devices are set to form parallel scan chains. Automatic test pattern generation (ATPG) vectors may be generated including input, output and mask vectors. Test patterns are generated with knowledge of where Xs are generated. Thus, certain output tester pins of the CUT are masked for predetermined samples. Samples may not be taken for masked pins. Scan chains of the CUT may be grouped and have corresponding end state variable devices with positive or negative designations. As with the embodiment of FIG. 5, the last state variable devices in a first set of scan chains may include positive sequential elements and the last stated variable devices in a second set of scan chains may include negative sequential elements.

In step 321, clock signals are generated. The clock signals may include shift clock signals and compressor clock signals. The compressor clock signals may have different phases. The different phased clock signals allow for simultaneous sampling of shifted and non-shifted scan chain output signals and/or sampling of different scan chains during different time intervals. Multiple sampling clock signals may be generated, such as the 0° sample clock signal 330 and the 90° sample clock signal 332, as well as the 180° clock signal 333 and the 270° clock signal 335.

In step 322, a test enable signal is generated, also as shown in FIGS. 5 and 7. The test enable signal initiates a scan test. The test enable signal configures the state variable devices to allow for data shift in and out operations.

In step 324, the CUT is operated in a first shift mode and scan test data is loaded into the scan chains. The scan test data may come from, for example, a scan memory, such as the scan memory 58.

In step 325, the CUT is operated in a functional mode and a capture signal is generated, as shown in FIGS. 5 and 7. Data at ends of the scan chains, such as the scan chain ends 224 and 226, is captured. Associated multiplexers may be pulled low to capture data.

In step 326, the CUT is operated in a second shift mode and data in the state variable devices is shifted out for sampling.

In step 328, upon the rising edge of a first clock signal, such as rising edge 329 of the 0° clock signal, test output data may be sampled across each scan chain output signal. In view of the embodiment of FIGS. 6 and 7, data across the scan chain output signals $SC_{Out1}$, $SC_{Out2}$, $SC_{Out3}$, $SC_{Out4}$ is sampled, as designated by data set sample O-D[1]/90-D[0]/180-D[0]/270-D[0].

In step 330, upon the rising edge of a second clock signal, such as rising edge 331 of the 90° clock signal, test output data may be sampled across each scan chain output signal. The sampled data may be unmasked, although it may have been previously masked in step 328.

In step 332, upon the rising edge of a third clock signal, such as the 180° clock signal 333, or upon the falling edge of the first clock signal 330 (designated step 332') test output data may be sampled across each scan chain output signal. The falling edge may be, for example, falling edge 337 of the 0° clock signal 330. The sampled data may be unmasked, although it may have been previously masked in steps 328 and 330.

In step 334, upon the rising edge of a fourth clock signal, such as the 270° clock signal 335, or upon the falling edge of the second clock signal 332 (designated step 334') test output data may be sampled across each scan chain output signal. The falling edge may be, for example, falling edge 339 of the 270° clock signal 335. Steps 324-334 and/or 326-334 may be continuously repeated. The sampled data may be unmasked, although it may have been previously masked in steps 328, 330, and 332. The tasks of steps 328-334 may be performed by a compressor network and/or a control module.

In step 336, the sampled data may be analyzed to detect faults and determine CUT performance characteristics.

Figure 9A:
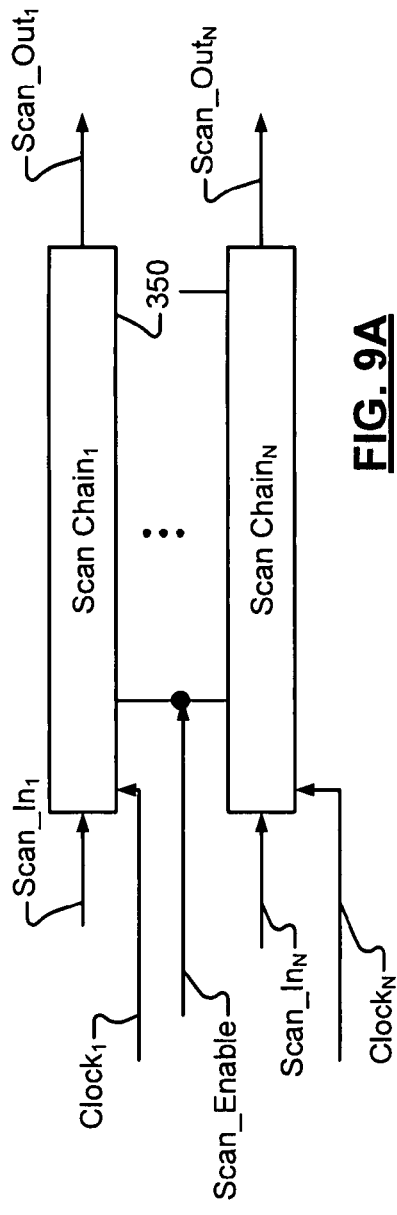
FIG. 9A is a functional block diagram of a parallel configuration of scan chains illustrating reception of different clock signals.

Referring to FIG. 9A, a functional block diagram of a parallel configuration of scan chains 350 illustrating reception of different clock signals $Clock_1$-$Clock_N$ is shown. A separate clock signal is used for each of the scan chains 350. The clock signals $Clock_1$-$Clock_N$ are routed to achieve equal propagational delays from each clock source. Delays through separate clock networks are balanced in order minimize clock skew so that system performance (i.e. operating frequency) is maximized. Scan test data $Scan\_In_1$-$Scan\_In_N$ is provided to the scan chains 350. Output scan data $Scan\_Out_1$-$Scan\_Out_N$ is shifted out based on the cock signals $Clock_1$-$Clock_N$.

Figure 9B:
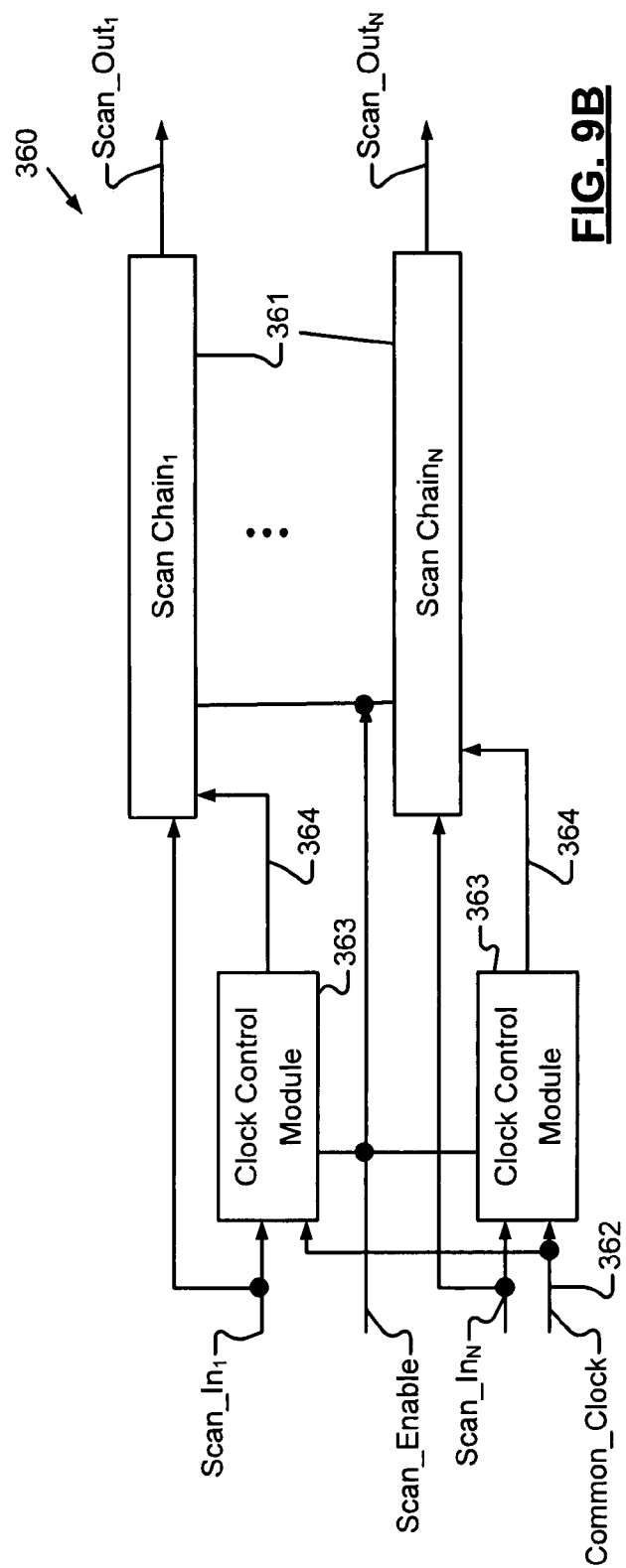
FIG. 9B is a functional block diagram of a clock control circuit.

Referring to FIG. 9B, a functional block diagram of a clock control circuit 360 with parallel configured scan chains 361 is shown. A common clock signal Common_Clock 362, such as a shift clock signal, is gated with an enable signal Scan_Enable via clock control modules 363. The clock control modules generate gated-clock signals 364. The gated-clock signals 364 are provided to flip-flops in each of the scan chains 361. The gated-clock signals 364 are also balanced to achieve equal propagational delays. Separate clock distribution networks may be used to provide the gated-clock signals 364 to the state variable devices in each of the scan chains 361.

Figure 10:
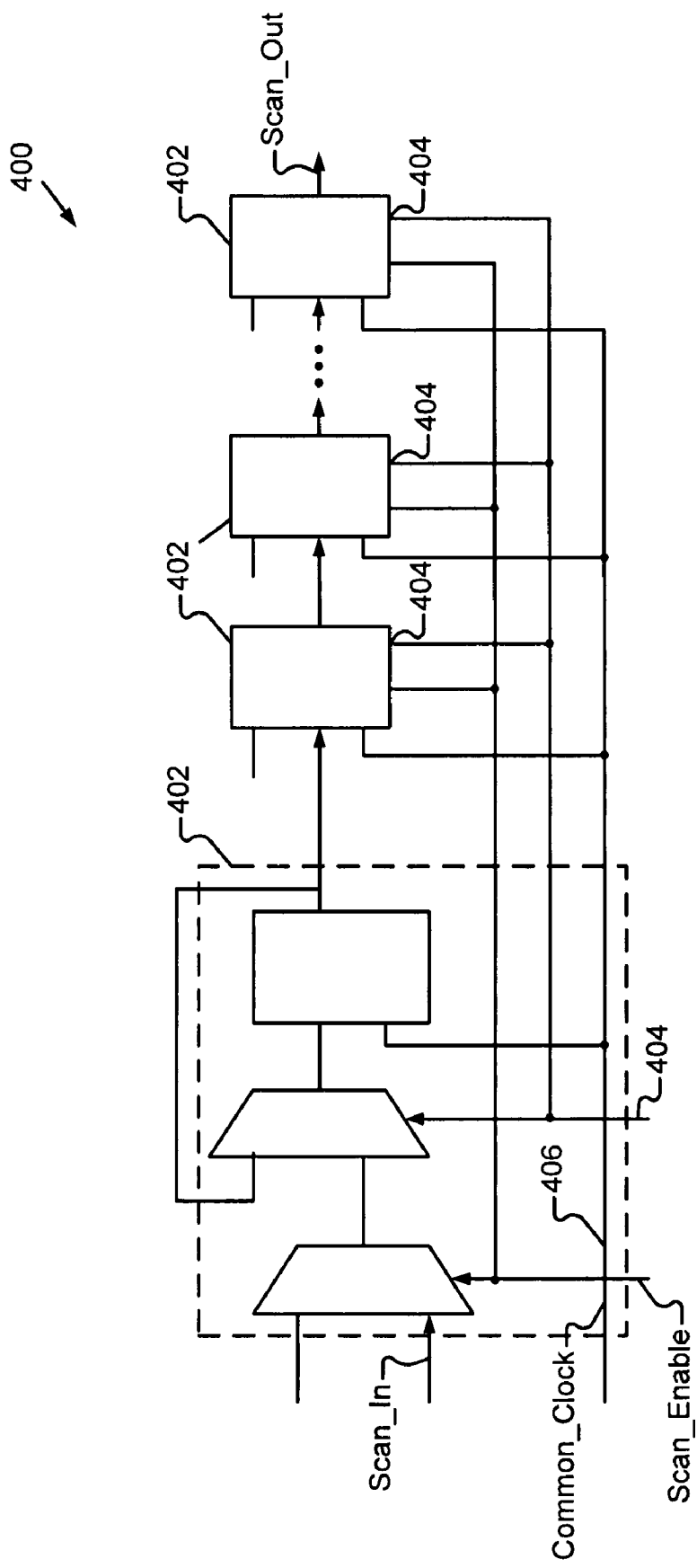
FIG. 10 is a functional block diagram of an example scan chain.

Referring to FIG. 10, a functional block diagram of an example scan chain 400 is shown. The scan chain 400 may be included in the CUTs 100, 200, 350, 361 of FIGS. 3, 4, 9A and 9B and in other CUTs of the present invention. The scan chain 400 includes flip-flops 402 that each has an enable input 404 that receives an enable signal Scan_Enable to maintain a present-state of the flip-flops 402. A common clock signal Common_Clock 406 is provided to the flip-flops 402. The enable signal Scan_Enable is used to control behavior of each of the flip-flops 402. Present states of the flip-flops 402 are re-circulated, when the scan chain 400 is not enabled, and new data is admitted into the flip-flops 402, when the scan chain 400 is enabled. The delay through enable networks may be minimized and different enable signals may be balanced with each other in order to allow operation of the scan chain 400 at increased speeds.

Figure 11:
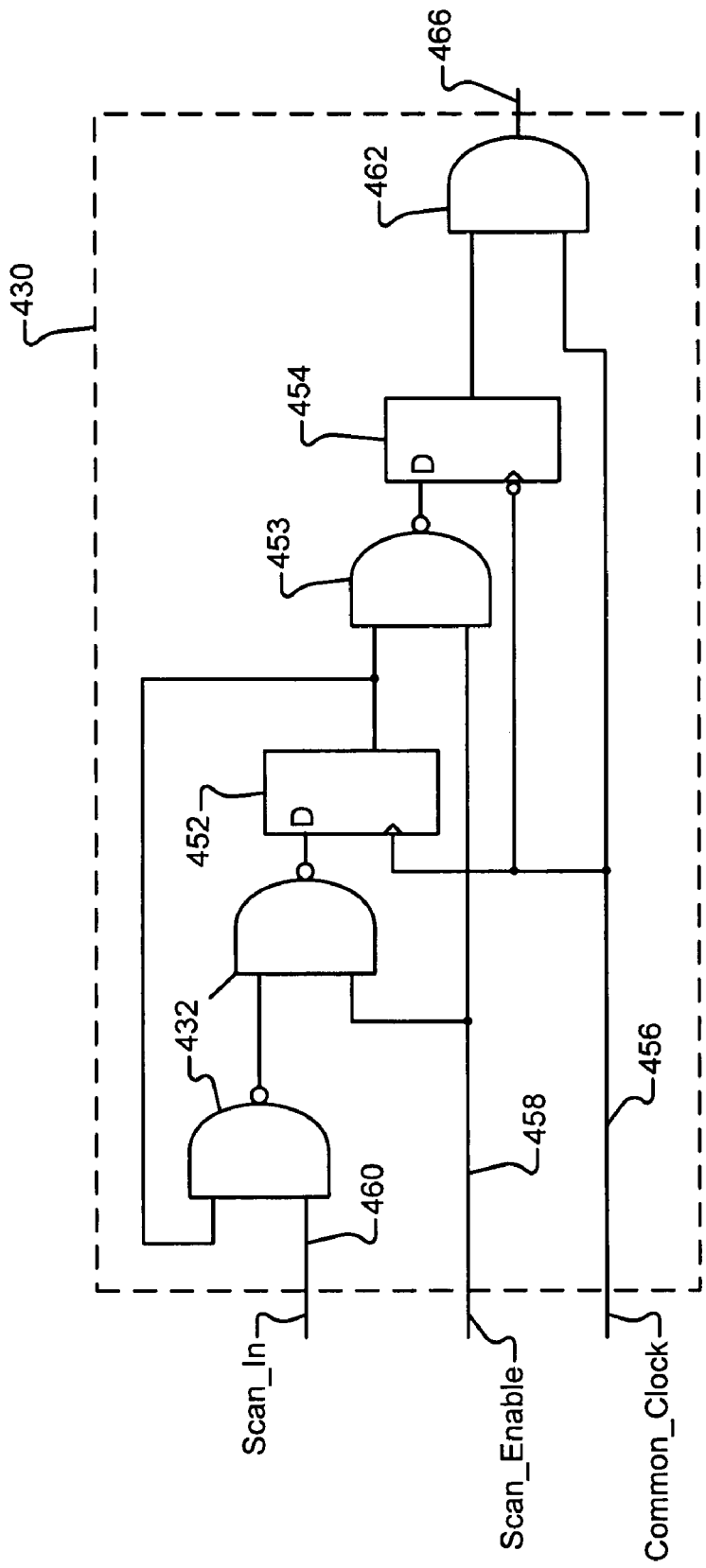
FIG. 11 is a functional block diagram of a clock control module that may be included in the clock control circuit.

Referring to FIG. 11, a functional block diagram of a clock control module 430 that may be included in the clock control circuit 360 of FIG. 9B. The clock control module 430 includes a pair of NAND gates 432, which receive a scan test data signal Scan_In. The NAND gates 432 are coupled in series and output thereof are provided to a flip-flop 452. Output of the flip-flop 452 is provided to a third NAND gate 453, which is in turn coupled to a latch 454. The flip-flop 452 changes state based on a rising edge of a received clock signal and the latch 454 changes states based on a negative-edge of the received clock signal. The flip-flop 452 and the latch 454 operate on a common clock signal Common-Clock on line 456. Output of the latch 454 and the common clock signal Common_Clock are provided to an AND gate 462 to generate a gated-clock signal 466, such as the gated clock signal 364.

After initialization with a control or enable signal Scan_Enable on line 458 set to logic "0", the flip-flop 452 is set to "1" and the latch 454 is set to "1". This allows passage of clock pulses from line 456 through to scan chain state variable devices, such as the flip-flops 402 of FIG. 10.

On a first rising-edge of a clock pulse on line 456, after the enable signal Scan_Enable is set to "1", a scan test data signal Scan_In on line 460 is loaded into flip-flop 452. Line 460 is gated by positive polarity output from the flip-flop 452 and the enable signal Scan_Enable. On a following falling-edge of the clock pulse on line 456 the value in the flip-flop 452 is inverted through NAND gate 453 and is transferred into the latch 454. Positive polarity output of the latch 454 forms an enable signal on line 464 to pass or block clocks pulses to scan chains. Clock signals provided to scan chains are ON when the scan test data signal Scan_In has values set to "0", and are OFF or blocked otherwise.

Referring now to FIGS. 12A-12G, various exemplary implementations incorporating the teachings of the present disclosure are shown. The above-described scan testing techniques may be applied to CUTs of various circuits, which are included in various devices, such as those provided with respect to FIGS. 12A-12G. In addition, a scan-based testing system, such as that described with respect to FIG. 2, may be in communication with one or more of the devices of FIGS. 12A-12G. For example, a scan-based testing system may receive scan test data from a hard disk drive (HDD) and/or provide scan output data to the HDD.

Figure 12A:
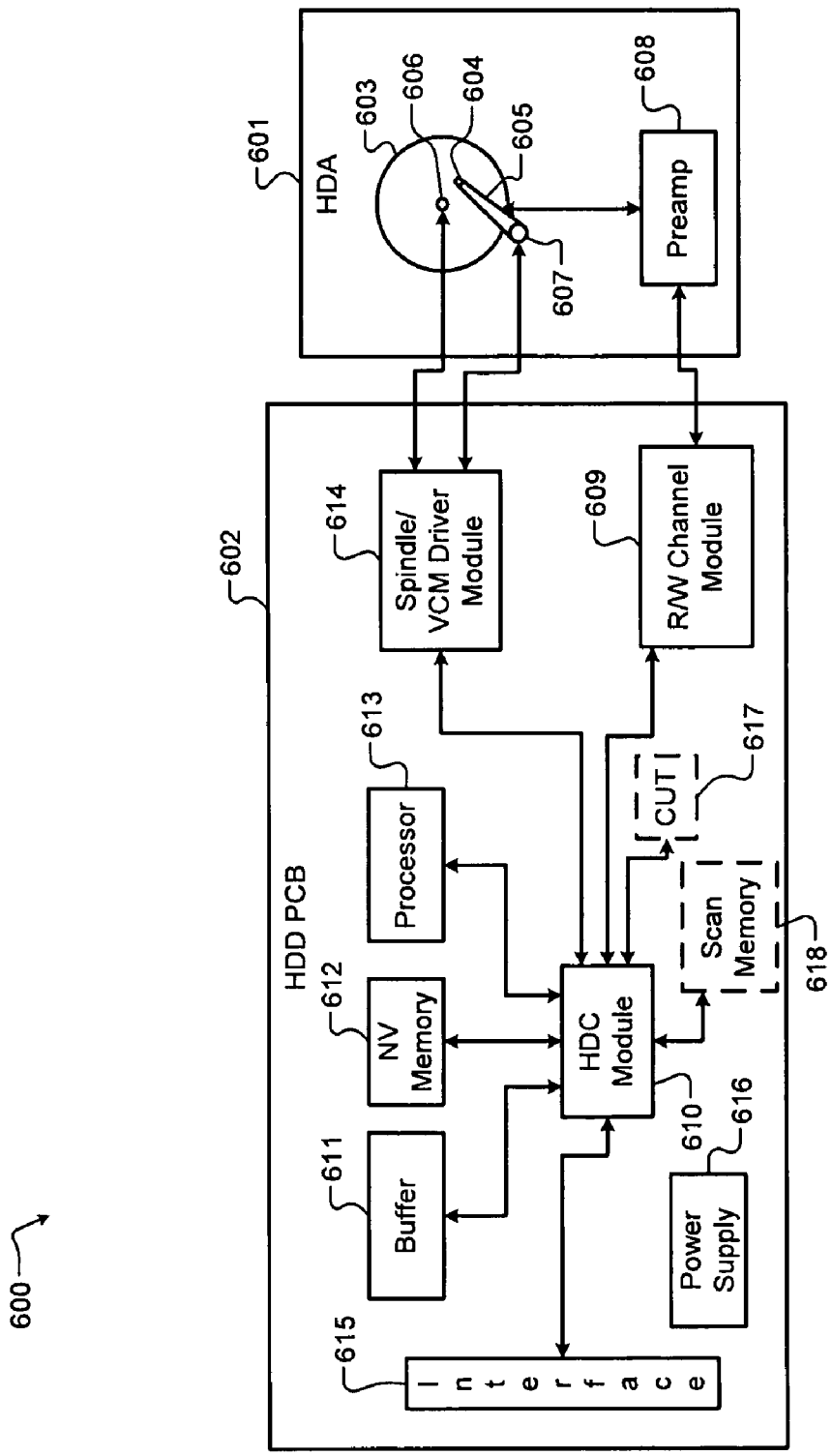
FIG. 12A is a functional block diagram of a hard disk drive.

Referring now to FIG. 12A, the teachings of the disclosure can be used to test CUTs of a HDD 600. The CUTs of the HDD 600 may include clock generation circuits and compressor networks, as described above. The HDD 600 includes a hard disk assembly (HDA) 601 and an HDD printed circuit board (PCB) 602. The HDA 601 may include a magnetic medium 603, such as one or more platters that store data, and a read/write device 604. The read/write device 604 may be arranged on an actuator arm 605 and may read and write data on the magnetic medium 603. Additionally, the HDA 601 includes a spindle motor 606 that rotates the magnetic medium 603 and a voice-coil motor (VCM) 607 that actuates the actuator arm 605. A preamplifier device 608 amplifies signals generated by the read/write device 604 during read operations and provides signals to the read/write device 604 during write operations.

The HDD PCB 602 includes a read/write channel module (hereinafter, "read channel") 609, a hard disk controller (HDC) module 610, a buffer 611, nonvolatile memory 612, a processor 613, and a spindle/VCM driver module 614. The HDD PCB 602 may include a CUT 617 and a scan memory 618, which may be part of the devices, modules, and/or memories of the HDD PCB 602 or may be separate stand-alone devices, as shown. The read channel 609 processes data received from and transmitted to the preamplifier device 608. The HDC module 610 controls components of the HDA 601 and communicates with an external device via an I/O interface 615. The external device may include a computer, a multimedia device, a mobile computing device, etc. The I/O interface 615 may include wireline and/or wireless communication links.

The HDC module 610 may receive data from the HDA 601, the read channel 609, the buffer 611, nonvolatile memory 612, the processor 613, the spindle/VCM driver module 614, and/or the I/O interface 615. The processor 613 may process the data, including encoding, decoding, filtering, and/or formatting. The processed data may be output to the HDA 601, the read channel 609, the buffer 611, nonvolatile memory 612, the processor 613, the spindle/VCM driver module 614, and/or the I/O interface 615.

The HDC module 610 may use the buffer 611 and/or nonvolatile memory 612 to store data related to the control and operation of the HDD 600. The buffer 611 may include DRAM, SDRAM, etc. The nonvolatile memory 612 may include flash memory (including NAND and NOR flash memory), phase change memory, magnetic RAM, or multi-state memory, in which each memory cell has more than two states. The spindle/VCM driver module 614 controls the spindle motor 606 and the VCM 607. The HDD PCB 602 includes a power supply 616 that provides power to the components of the HDD 600.

Figure 12B:
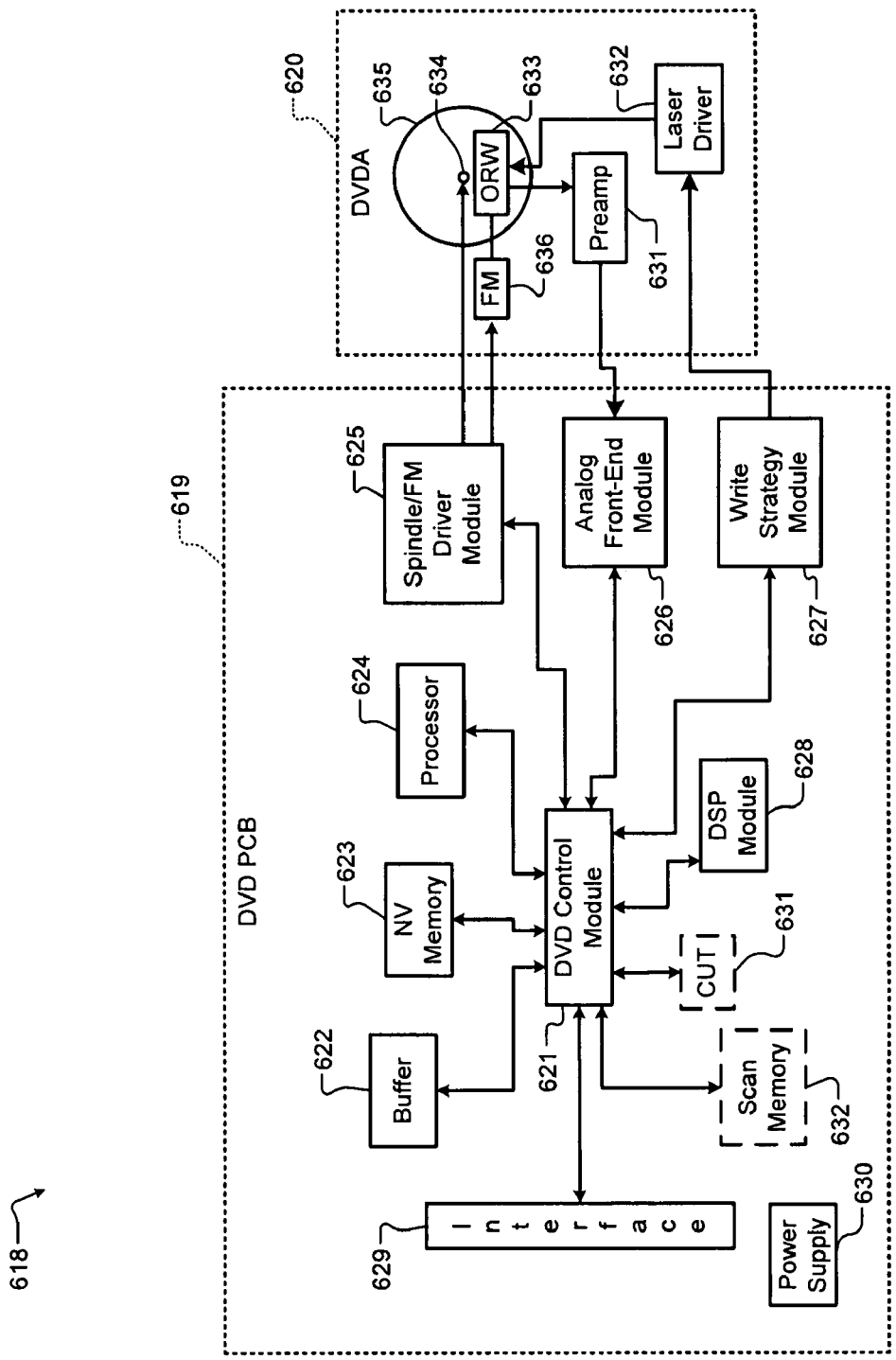
FIG. 12B is a functional block diagram of a DVD drive.

Referring now to FIG. 12B, the teachings of the disclosure can be used to test CUTs of a DVD drive 618 or of a CD drive.

The CUTs of the DVD drive 618 may include clock generation circuits and compressor networks, as described above. The DVD drive 618 includes a DVD PCB 619 and a DVD assembly (DVDA) 620. The DVD PCB 619 includes a DVD control module 621, a buffer 622, nonvolatile memory 623, a processor 624, a spindle/FM (feed motor) driver module 625, an analog front-end module 626, a write strategy module 627, and a DSP module 628. The DVD PCB 619 may include a CUT 631 and a scan memory 632, which may be part of the devices, modules, and/or memories of the DVD PCB 619 or may be separate stand-alone devices, as shown.

The DVD control module 621 controls components of the DVDA 620 and communicates with an external device via an I/O interface 629. The external device may include a computer, a multimedia device, a mobile computing device, etc. The I/O interface 629 may include wireline and/or wireless communication links.

The DVD control module 621 may receive data from the buffer 622, nonvolatile memory 623, the processor 624, the spindle/FM driver module 625, the analog front-end module 626, the write strategy module 627, the DSP module 628, and/or the I/O interface 629. The processor 624 may process the data, including encoding, decoding, filtering, and/or formatting. The DSP module 628 performs signal processing, such as video and/or audio coding/decoding. The processed data may be output to the buffer 622, nonvolatile memory 623, the processor 624, the spindle/FM driver module 625, the analog front-end module 626, the write strategy module 627, the DSP module 628, and/or the I/O interface 629.

The DVD control module 621 may use the buffer 622 and/or nonvolatile memory 623 to store data related to the control and operation of the DVD drive 618. The buffer 622 may include DRAM, SDRAM, etc. The nonvolatile memory 623 may include flash memory (including NAND and NOR flash memory), phase change memory, magnetic RAM, or multi-state memory, in which each memory cell has more than two states. The DVD PCB 619 includes a power supply 630 that provides power to the components of the DVD drive 618.

The DVDA 620 may include a preamplifier device 631, a laser driver 632, and an optical device 633, which may be an optical read/write (ORW) device or an optical read-only (OR) device. A spindle motor 634 rotates an optical storage medium 635, and a feed motor 636 actuates the optical device 633 relative to the optical storage medium 635.

When reading data from the optical storage medium 635, the laser driver provides a read power to the optical device 633. The optical device 633 detects data from the optical storage medium 635, and transmits the data to the preamplifier device 631. The analog front-end module 626 receives data from the preamplifier device 631 and performs such functions as filtering and ND conversion. To write to the optical storage medium 635, the write strategy module 627 transmits power level and timing data to the laser driver 632. The laser driver 632 controls the optical device 633 to write data to the optical storage medium 635.

Figure 12D:
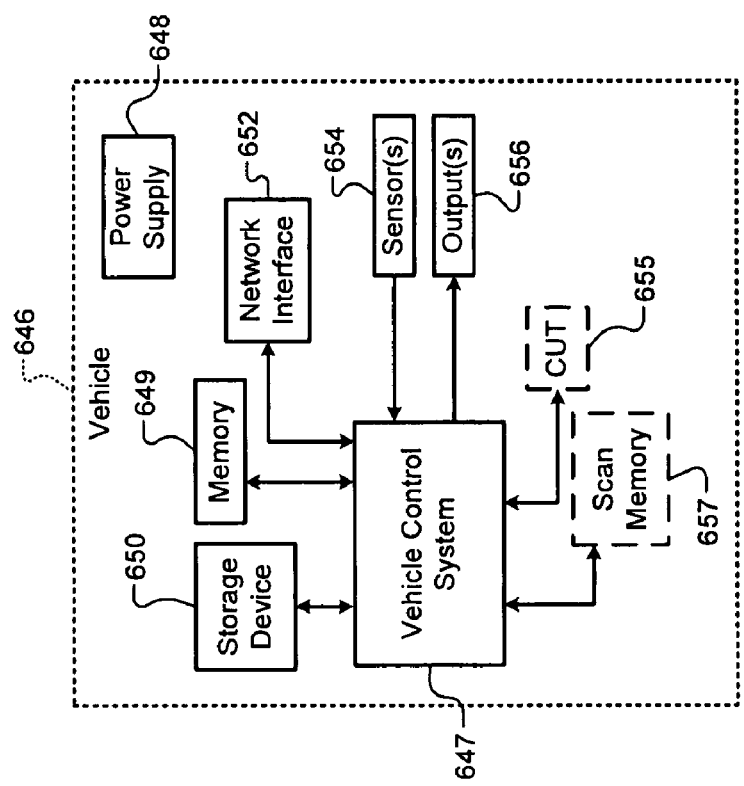
FIG. 12D is a functional block diagram of a vehicle control system.
Figure 12C:
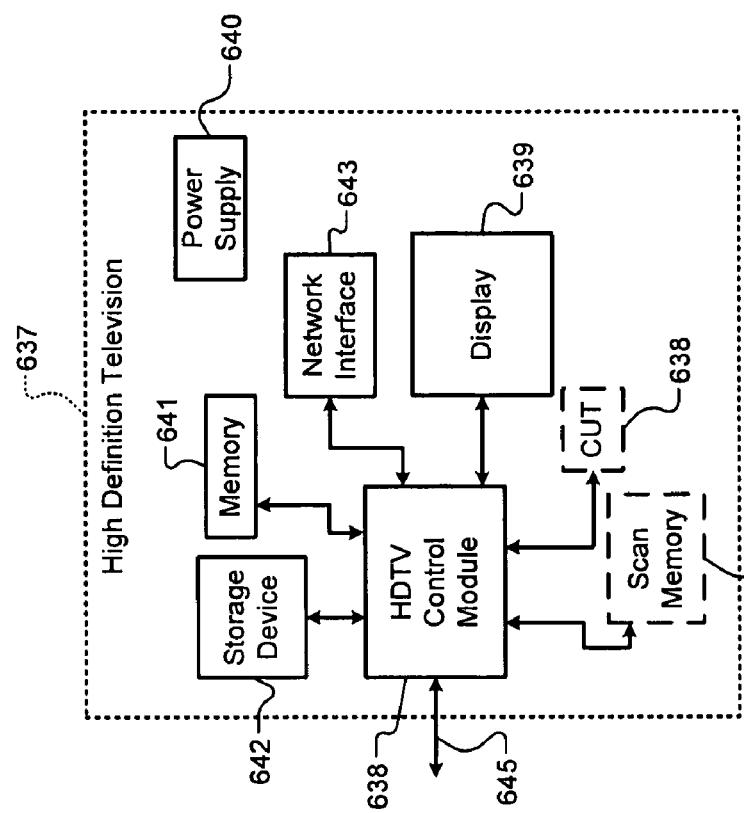
FIG. 12C is a functional block diagram of a high definition television.

Referring now to FIG. 12C, the teachings of the disclosure can be used to test CUTs of a high definition television (HDTV) 637. The CUTs of the HDTV 637 may include clock generation circuits and compressor networks, as described above. The HDTV 637 includes an HDTV control module 638, a display 639, a power supply 640, memory 641, a storage device 642, a network interface 643, and an external interface 645. The HDTV 637 may include a CUT 638 and a scan memory 644, which may be part of the devices, modules, and/or memories of the HDTV 637 or may be separate stand-alone devices, as shown. If the network interface 643 includes a wireless local area network interface, an antenna may be included.

The HDTV 637 can receive input signals from the network interface 643 and/or the external interface 645, which can send and receive data via cable, broadband Internet, and/or satellite. The HDTV control module 638 may process the input signals, including encoding, decoding; filtering, and/or formatting, and generate output signals. The output signals may be communicated to one or more of the display 639, memory 641, the storage device 642, the network interface 643, and the external interface 645.

Memory 641 may include random access memory (RAM) and/or nonvolatile memory such as flash memory, phase change memory, or multi-state memory, in which each memory cell has more than two states. The storage device 642 may include an optical storage drive, such as a DVD drive, and/or a hard disk drive (HDD). The HDTV control module 638 communicates externally via the network interface 643 and/or the external interface 645. The power supply 640 provides power to the components of the HDTV 637.

Referring now to FIG. 12D, the teachings of the disclosure can be used to test CUTs of a vehicle 646. The CUTs of the vehicle 646 may include clock generation circuits and compressor networks, as described above. The vehicle 646 may include a vehicle control system 647, a power supply 648, memory 649, a storage device 650, and a network interface 652. The vehicle 646 may include a CUT 655 and a scan memory 657, which may be part of the devices, modules, and/or memories of the vehicle 646 or may be separate stand-alone devices, as shown. If the network interface 652 includes a wireless local area network interface, an antenna may be included. The vehicle control system 647 may be a powertrain control system, a body control system, an entertainment control system, an anti-lock braking system (ABS), a navigation system, a telematics system, a lane departure system, an adaptive cruise control system, etc.

The vehicle control system 647 may communicate with one or more sensors 654 and generate one or more output signals 656. The sensors 654 may include temperature sensors, acceleration sensors, pressure sensors, rotational sensors, airflow sensors, etc. The output signals 656 may control engine operating parameters, transmission operating parameters, suspension parameters, etc.

The power supply 648 provides power to the components of the vehicle 646. The vehicle control system 647 may store data in memory 649 and/or the storage device 650. Memory 649 may include random access memory (RAM) and/or nonvolatile memory such as flash memory, phase change memory, or multi-state memory, in which each memory cell has more than two states. The storage device 650 may include an optical storage drive, such as a DVD drive, and/or a hard disk drive (HDD). The vehicle control system 647 may communicate externally using the network interface 652.

Figure 12F:
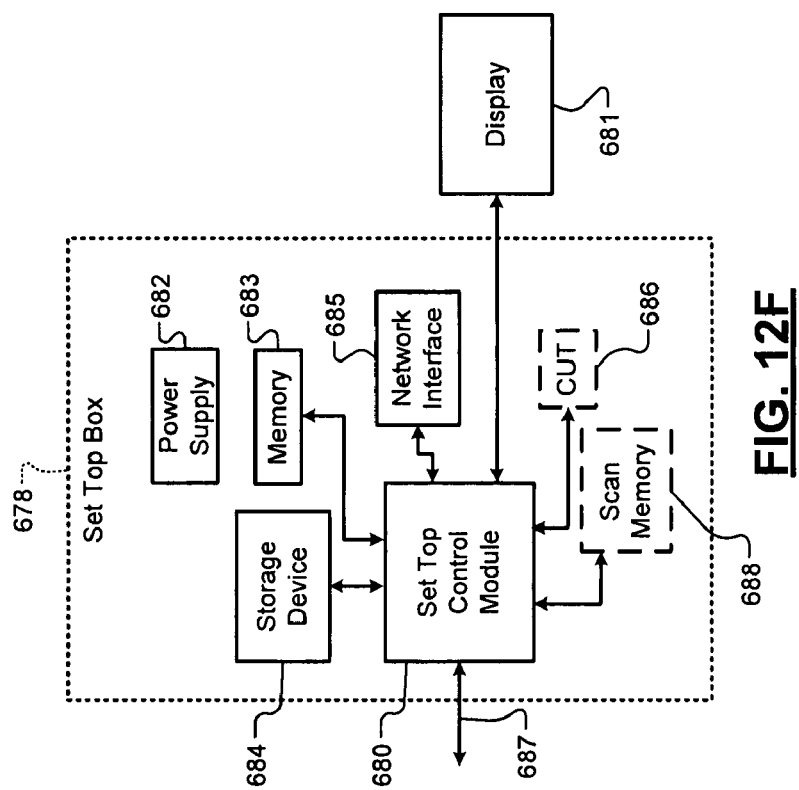
FIG. 12F is a functional block diagram of a set top box.
Figure 12E:
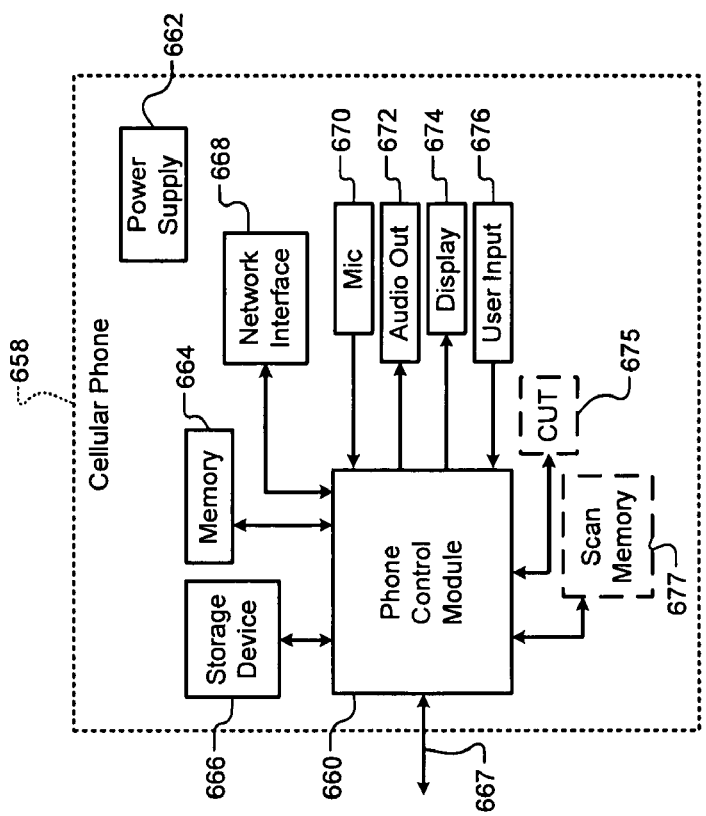
FIG. 12E is a functional block diagram of a cellular phone.

Referring now to FIG. 12E, the teachings of the disclosure can be used to test CUTs of a cellular phone 658. The CUTs of the cellular phone 658 may include clock generation circuits and compressor networks, as described above. The cellular phone 658 includes a phone control module 660, a power supply 662, memory 664, a storage device 666, and a cellular network interface 667. The cellular phone 658 may include a network interface 668, a microphone 670, an audio output 672 such as a speaker and/or output jack, a display 674, and a user input device 676 such as a keypad and/or pointing device. The cellular phone 658 may include a CUT 675 and a scan memory 677, which may be part of the devices, modules, and/or memories of the cellular phone 658 or may be separate stand-alone devices, as shown. If the network interface 668 includes a wireless local area network interface, an antenna may be included.

The phone control module 660 may receive input signals from the cellular network interface 667, the network interface 668, the microphone 670, and/or the user input device 676. The phone control module 660 may process signals, including encoding, decoding, filtering, and/or formatting, and generate output signals. The output signals may be communicated to one or more of memory 664, the storage device 666, the cellular network interface 667, the network interface 668, and the audio output 672.

Memory 664 may include random access memory (RAM) and/or nonvolatile memory such as flash memory, phase change memory, or multi-state memory, in which each memory cell has more than two states. The storage device 666 may include an optical storage drive, such as a DVD drive, and/or a hard disk drive (HDD). The power supply 662 provides power to the components of the cellular phone 658.

Referring now to FIG. 12F, the teachings of the disclosure can be used to test CUTs of a set top box 678. The CUTs of the set top box 678 may include clock generation circuits and compressor networks, as described above. The set top box 678 includes a set top control module 680, a display 681, a power supply 682, memory 683, a storage device 684, and a network interface 685. The set top box 678 may include a CUT 686 and a scan memory 688, which may be part of the devices, modules, and/or memories of the set top box 678 or may be separate stand-alone devices, as shown. If the network interface 685 includes a wireless local area network interface, an antenna may be included.

The set top control module 680 may receive input signals from the network interface 685 and an external interface 687, which can send and receive data via cable, broadband Internet, and/or satellite. The set top control module 680 may process signals, including encoding, decoding, filtering, and/or formatting, and generate output signals. The output signals may include audio and/or video signals in standard and/or high definition formats. The output signals may be communicated to the network interface 685 and/or to the display 681. The display 681 may include a television, a projector, and/or a monitor.

The power supply 682 provides power to the components of the set top box 678. Memory 683 may include random access memory (RAM) and/or nonvolatile memory such as flash memory, phase change memory, or multi-state memory, in which each memory cell has more than two states. The storage device 684 may include an optical storage drive, such as a DVD drive, and/or a hard disk drive (HDD).

Figure 12G:
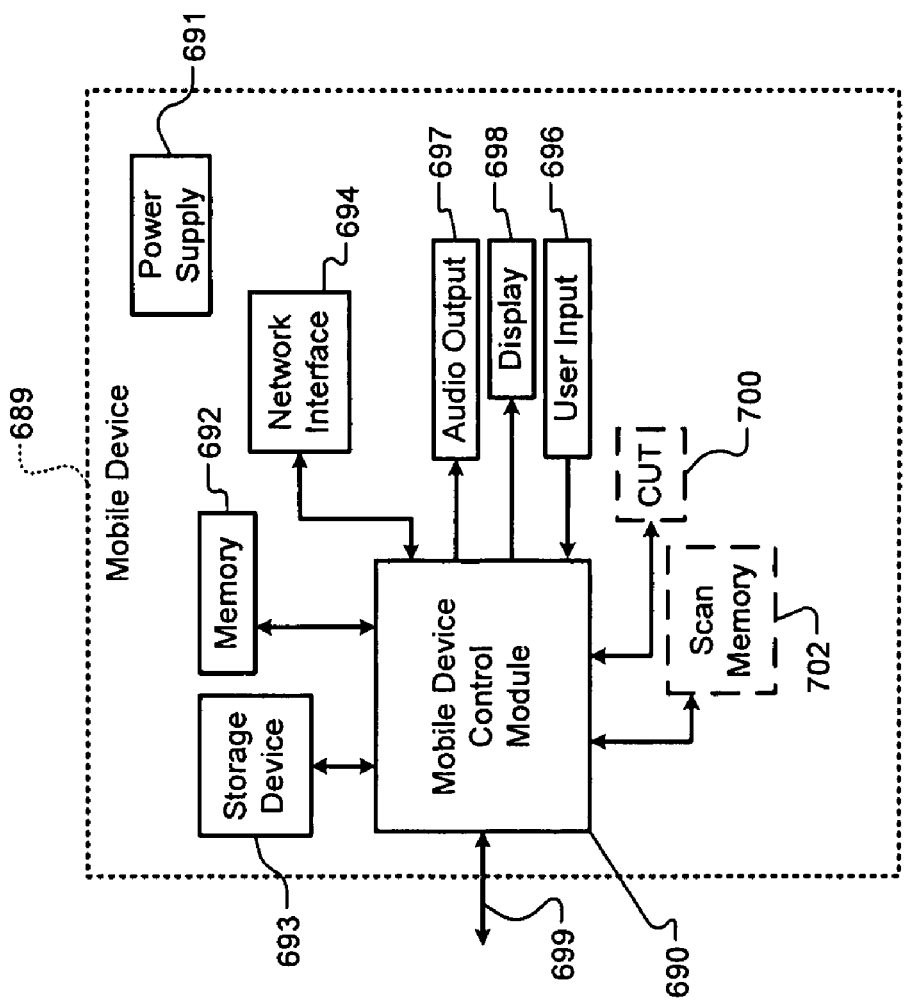
FIG. 12G is a functional block diagram of a mobile device.

Referring now to FIG. 12G, the teachings of the disclosure can be used to test CUTs of a mobile device 689. The CUTs of the mobile device 689 may include clock generation circuits and compressor networks, as described above. The mobile device 689 may include a mobile device control module 690, a power supply 691, memory 692, a storage device 693, a network interface 694, and an external interface 699. The mobile device 689 may include a CUT 700 and a scan memory 702, which may be part of the devices, modules, and/or memories of the mobile device 689 or may be separate stand-alone devices, as shown. If the network interface 694 includes a wireless local area network interface, an antenna may be included.

The mobile device control module 690 may receive input signals from the network interface 694 and/or the external interface 699. The external interface 699 may include USB, infrared, and/or Ethernet. The input signals may include compressed audio and/or video, and may be compliant with the MP3 format. Additionally, the mobile device control module 690 may receive input from a user input 696 such as a keypad, touchpad, or individual buttons. The mobile device control module 690 may process input signals, including encoding, decoding, filtering, and/or formatting, and generate output signals.

The mobile device control module 690 may output audio signals to an audio output 697 and video signals to a display 698. The audio output 697 may include a speaker and/or an output jack. The display 698 may present a graphical user interface, which may include menus, icons, etc. The power supply 691 provides power to the components of the mobile device 689. Memory 692 may include random access memory (RAM) and/or nonvolatile memory such as flash memory, phase change memory, or multi-state memory, in which each memory cell has more than two states. The storage device 693 may include an optical storage drive, such as a DVD drive, and/or a hard disk drive (HDD). The mobile device may include a personal digital assistant, a media player, a laptop computer, a gaming console, or other mobile computing device.

Those skilled in the art can now appreciate from the foregoing description that the broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification, and the following claims.

What is claimed is:

1. A scan test circuit comprising:
a plurality of tester inputs that receive scan test data;
a plurality of scan chains that are coupled to said plurality of tester inputs;
a plurality of tester outputs that are coupled to said plurality of scan chains,
wherein said plurality of scan chains provide output test data based on said scan test data;
a first clock that generates a first clock signal; and
a sampling circuit that samples output test data from each of said plurality of scan chains at least twice per clock cycle of said first clock signal.

2. The scan test circuit of claim 1, wherein said plurality of scan chains generate scan chain output signals that are offset from each other in time.

3. The scan test circuit of claim 1, wherein said plurality of scan chains generates:
a first set of scan chain output signals that change based on a rising edge of said first clock signal; and
a second set of scan chain output signals that change based on a falling edge of said first clock signal.

4. The scan test circuit of claim 1, wherein said plurality of scan chains generate a first data signal and a second data signal, wherein said second data signal overlaps said first data signal in time.

5. The scan test circuit of claim 1, wherein a first portion of said plurality of scan chains ends with a positive edge element, and wherein a second portion of said plurality of scan chains ends with a negative edge element.

6. The scan test circuit of claim 1, comprising a control module that transmits test data to said plurality of scan chains and monitors said plurality of tester outputs.

7. The scan test circuit of claim 1, wherein each of said plurality of scan chains includes a plurality of serially coupled state variable devices.

8. The scan test circuit of claim 7, wherein said state variable devices include flip-flops.

9. The scan test circuit of claim 1, further comprising a combinational logic circuit coupled between adjacent scan chains of said plurality of scan chains.

10. The scan test circuit of claim 1, wherein said plurality of scan chains comprises:
a first set of scan chains that include a first set of state variable devices that receive said first clock signal; and
a second set of scan chains that include a second set of state variable devices that receive an inversion of said first clock signal.

11. The scan test circuit of claim 10, wherein said sampling circuit captures data output from said first and second sets of state variable devices.

12. The scan test circuit of claim 10, further comprising a compressor that receives and compresses data output from said first and second sets of state variable devices to generate said output test data.

13. The scan test circuit of claim 1, further comprising a second clock that generates a second clock signal that is out of phase with said first clock signal,
wherein said sampling circuit samples said output test data from each of said plurality of scan chains at least twice per clock cycle of said second clock signal.

14. The scan test circuit of claim 13, wherein said sampling circuit samples said output test data from each of said plurality of scan chains four times per clock cycle of said first clock signal and per clock cycle of said second clock signal.

15. The scan test circuit of claim 13, wherein said plurality of scan chains comprises:
a first set of scan chains that include a first set of flip-flops that receive said first clock signal;
a second set of scan chains that include a second set of flip-flops that receive said second clock signal;
a third set of scan chains that include a third set of flip-flops that receive an inversion of said first clock signal; and
a fourth set of scan chains that include a fourth set of flip-flops that receive an inversion of said second clock signal.

16. The scan test circuit of claim 15, wherein said sampling circuit captures data output from said first, second, third and fourth sets of flip-flops.

17. The scan test circuit of claim 15, further comprising a compressor that receives data output from said first, second, third and fourth sets of flip-flops and that generates said output test data based thereon.

18. The scan test circuit of claim 1, wherein each clock cycle of said first clock signal includes first and second edges,
wherein said first and second edges include rising and/or falling edges, and
wherein said sampling circuit captures said output test data from each of said plurality of scan chains based on said first and second edges.

19. The scan test circuit of claim 18, wherein said plurality of tester inputs receives an unknown signal (X),
wherein the scan test circuit further comprises a compressor that masks a tester output of said plurality of tester outputs based on said first edge and said unknown signal (X), and
wherein said plurality of tester outputs receives unmasked data from said compressor based on said second edge.

20. The scan test circuit of claim 18, wherein said plurality of tester inputs receives an unknown signal (X),
wherein the scan test circuit further comprises a control module that masks a tester output of said plurality of tester outputs based on said first edge and said unknown signal (X), and
wherein said plurality of tester outputs receives unmasked data from said control module based on said second edge.

21. The scan test circuit of claim 20, wherein said control module detects a fault of the scan test circuit based said output test data and said second edge.

22. The scan test circuit of claim 1, wherein said plurality of tester inputs receives an unknown signal (X),
wherein the scan test circuit further comprises a compressor that masks a tester output of said plurality of tester outputs based on said first clock signal and said unknown signal (X), and
wherein said plurality of tester outputs receives unmasked data from said compressor based on a second clock signal that overlaps said first clock signal in time.

23. The scan test circuit of claim 1, further comprising:
a decompressor coupled between said plurality of tester inputs and said plurality of scan chains; and
a compressor coupled between said plurality of scan chains and said plurality of tester outputs.

24. A scan-based system comprising the scan test circuit of claim 1 and further comprising:
a memory that stores at least one of said scan test data and said output test data; and
a control module that is coupled to said plurality of tester inputs, said sampling circuit, and said memory,
wherein said control module operates scan test software to generate said scan test data and monitors the scan test circuit for faults based on said output test data.

25. The scan test circuit of claim 1, wherein:
said plurality of scan chains generate scan chain output signals that are offset from each other in time; and
said plurality of scan chains generates:
a first set of scan chain output signals that change based on a rising edge of said first clock signal; and
a second set of scan chain output signals that change based on a falling edge of said first clock signal.

26. The scan test circuit of claim 1, wherein:
said plurality of scan chains generates:
a first set of scan chain output signals that change based on a rising edge of said first clock signal; and
a second set of scan chain output signals that change based on a falling edge of said first clock signal; and
said plurality of scan chains comprises:
a first set of scan chains that include a first set of state variable devices that receive said first clock signal; and
a second set of scan chains that include a second set of state variable devices that receive an inversion of said first clock signal.

27. The scan test circuit of claim 1, wherein:
said sampling circuit captures said output test data from each of said plurality of scan chains based on rising and falling edges of said first clock signal; and
said plurality of scan chains generates:
a first set of scan chain output signals that change based on a rising edge of said first clock signal; and
a second set of scan chain output signals that change based on a falling edge of said first clock signal.

28. A method of performing a scan test on a circuit under test (CUT), the method comprising:
receiving scan test data from a plurality of tester inputs that are coupled to a plurality of scan chains;
providing output test data based on said scan test data via a plurality of scan chains;
generating a first clock signal; and sampling output test data from each of said plurality of scan chains at least twice per clock cycle of said first clock signal.

29. The method of claim 28, further comprising generating scan chain output signals that are offset from each other in time via said plurality of scan chains.

30. The method of claim 28, further comprising:
generating a first set of scan chain output signals that change based on a rising edge of said first clock signal; and
generating a second set of scan chain output signals that change based on a falling edge of said first clock signal.

31. The method of claim 28, further comprising generating a first data signal and a second data signal, wherein said second data signal overlaps said first data signal in time via said plurality of scan chains.

32. The method of claim 28, further comprising:
transmitting test data to said plurality of scan chains; and
monitoring said plurality of tester outputs.

33. The method of claim 28, further comprising:
receiving said first clock signal via a first set of state variable devices of a first set of said plurality of scan chains; and
receiving an inversion of said first clock signal via a second set of state variable devices of a second set of said plurality of scan chains.

34. The method of claim 33, further comprising capturing data output from said first and second sets of state variable devices.

35. The method of claim 33, further comprising receiving and compressing data output from said first and second sets of state variable devices to generate said output test data.

36. The method of claim 28, further comprising:
generating a second clock signal that is out of phase with said first clock signal; and
sampling said output test data from each of said plurality of scan chains at least twice per clock cycle of said second clock signal.

37. The method of claim 36, further comprising sampling said output test data from each of said plurality of scan chains four times per clock cycle of said first clock signal and per clock cycle of said second clock signal.

38. The method of claim 36, further comprising:
receiving said first clock signal via a first set of flip-flops of a first set of said plurality of scan chains;
receiving said second clock signal via a second set of flip-flops of a second set of said plurality of scan chains;
receiving an inversion of said first clock signal via a third set of flip-flops of a third set of said plurality of scan chains; and
receiving an inversion of said second clock signal via a fourth set of flip-flops of a fourth set of said plurality of scan chains.

39. The method of claim 38, further comprising capturing data output from said first, second, third and fourth sets of flip-flops.

40. The method of claim 38, further comprising:
receiving data output from said first, second, third and fourth sets of flip-flops; and
generating said output test data based thereon.

41. The method of claim 28, further comprising capturing said output test data from each of said plurality of scan chains based on first and second edges of each clock cycle of said first clock signal,
wherein said first and second edges include rising and/or falling edges.

42. The method of claim 41, further comprising:
receiving an unknown signal (X);
masking a tester output of said plurality of tester outputs based on said first edge via a compressor and said unknown signal (X); and
receiving unmasked data from said compressor based on said second edge via said plurality of tester outputs.

43. The method of claim 41, further comprising:
receiving an unknown signal (X);
masking a tester output of said plurality of tester outputs based on said first edge via a control module and said unknown signal (X), and
receiving unmasked data from said control module based on said second edge via said plurality of tester outputs.

44. The method of claim 43, further comprising detecting a fault of the scan test circuit based said output test data and said second edge.

45. The method of claim 28, further comprising:
receiving an unknown signal (X);
masking a tester output of said plurality of tester outputs based on said first clock signal via a compressor and said unknown signal (X), and
receiving unmasked data from said compressor based on a second clock signal that overlaps said first clock signal in time.

46. The method of claim 28, further comprising: storing at least one of said scan test data and said output test data;
generating said scan test data via scan test software; and
monitoring the scan test circuit for faults based on said output test data.

* * * * *